(12) United States Patent
Lin et al.

(10) Patent No.: US 12,009,253 B2
(45) Date of Patent: *Jun. 11, 2024

(54) SEMICONDUCTOR STRUCTURE WITH STAGGERED SELECTIVE GROWTH

(71) Applicant: Taiwan Semiconductor Manufacturing Co., Ltd., Hsin-Chu (TW)

(72) Inventors: Zhi-Chang Lin, Hsinchu County (TW); Teng-Chun Tsai, Hsinchu (TW); Wei-Hao Wu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 781 days.

This patent is subject to a terminal disclaimer.

(21) Appl. No.: 17/099,564

(22) Filed: Nov. 16, 2020

(65) Prior Publication Data

US 2021/0090944 A1    Mar. 25, 2021

Related U.S. Application Data

(63) Continuation of application No. 16/366,984, filed on Mar. 27, 2019, now Pat. No. 10,840,133.

(Continued)

(51) Int. Cl.
*H01L 21/768* (2006.01)
*H01L 21/02* (2006.01)
(Continued)

(52) U.S. Cl.
CPC .... *H01L 21/76835* (2013.01); *H01L 21/0228* (2013.01); *H01L 21/02304* (2013.01);
(Continued)

(58) Field of Classification Search
CPC .......... H01L 21/76835; H01L 21/0228; H01L 21/02304; H01L 21/31144;
(Continued)

(56) References Cited

U.S. PATENT DOCUMENTS 6,720,660 B1 * 4/2004 Ushiyama ......... H01L 21/31116
257/E21.585
10,840,133 B2 * 11/2020 Lin .................. H01L 21/76802
(Continued)

FOREIGN PATENT DOCUMENTS

CN        101226960 A    7/2008
CN        101488453 A    7/2009
(Continued)

*Primary Examiner* — Tong-Ho Kim
(74) *Attorney, Agent, or Firm* — Haynes and Boone, LLP

(57) ABSTRACT

The present disclosure provides one embodiment of a semiconductor structure. The semiconductor structure includes a semiconductor substrate; a first conductive feature and a second conductive feature disposed on the semiconductor substrate; and a staggered dielectric feature interposed between the first and second conductive feature. The staggered dielectric feature includes first dielectric layers and second dielectric layers being interdigitated. The first dielectric layers include a first dielectric material and the second dielectric layers include a second dielectric material being different from the first dielectric material.

20 Claims, 29 Drawing Sheets

Related U.S. Application Data

(60) Provisional application No. 62/737,279, filed on Sep. 27, 2018.

(51) Int. Cl.

| | | |
|---|---|---|
| *H01L 21/311* | (2006.01) | |
| *H01L 21/8234* | (2006.01) | |
| *H01L 23/528* | (2006.01) | |
| *H01L 23/532* | (2006.01) | |
| *H01L 27/088* | (2006.01) | |
| *H01L 29/417* | (2006.01) | |
| *H01L 29/423* | (2006.01) | |

(52) U.S. Cl.
CPC .. *H01L 21/31144* (2013.01); *H01L 21/76802* (2013.01); *H01L 21/76837* (2013.01); *H01L 21/76877* (2013.01); *H01L 21/823475* (2013.01); *H01L 23/5283* (2013.01); *H01L 23/53295* (2013.01); *H01L 27/0886* (2013.01); *H01L 29/41791* (2013.01); *H01L 29/4232* (2013.01)

(58) Field of Classification Search
CPC ......... H01L 21/76802; H01L 21/76837; H01L 21/76877; H01L 21/823475; H01L 23/5283; H01L 23/53295; H01L 27/0886; H01L 29/41791; H01L 29/4232; H01L 21/31116; H01L 21/76801; H01L 21/76834; H01L 21/76897; H01L 29/66795; H01L 29/785; H01L 21/022; H01L 21/76804; H01L 21/76814; H01L 21/76816; H01L 21/76879; H01L 21/76838; H01L 21/823418; H01L 21/823431
USPC ........................................................ 257/773
See application file for complete search history.

(56) References Cited

U.S. PATENT DOCUMENTS

| | | |
|---|---|---|
| 2012/0181615 A1 | 7/2012 | Shimizu et al. |
| 2016/0104673 A1 | 4/2016 | Tung |
| 2017/0025309 A1 | 1/2017 | Ting et al. |
| 2018/0114846 A1 | 4/2018 | Alptekin et al. |
| 2018/0174904 A1 | 6/2018 | Hsieh et al. |

FOREIGN PATENT DOCUMENTS

| | | |
|---|---|---|
| JP | 2002319583 | 10/2002 |
| KR | 20170036128 | 3/2017 |
| KR | 20180060952 | 6/2018 |
| TW | 523929 | 3/2003 |
| TW | 201700768 | 1/2017 |
| TW | I623047 B | 5/2018 |
| TW | 201833362 A | 9/2018 |

* cited by examiner

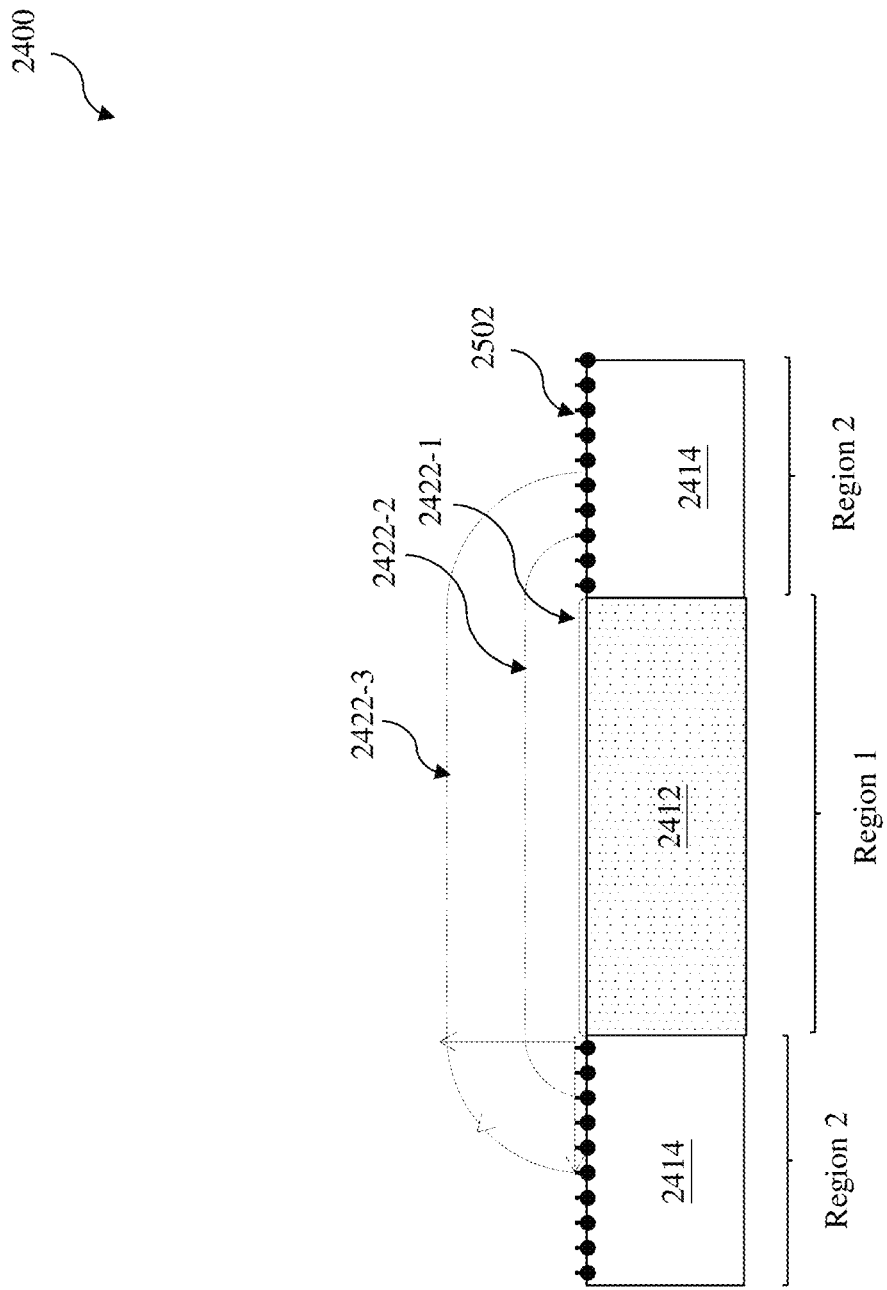

SEMICONDUCTOR STRUCTURE WITH STAGGERED SELECTIVE GROWTH

PRIORITY DATA

This application This application is a Continuation of U.S. patent application Ser. No. 16/366,984, filed Mar. 27, 2019, which claims priority to U.S. Provisional Patent Application Ser. No. 62/737,279 filed Sep. 27, 2018, the entire disclosures of which are incorporated herein by reference.

BACKGROUND

Integrated circuits have progressed to advanced technologies with smaller feature sizes. In these advanced technologies, the gate pitch (spacing) continuously shrinks and therefore induces contact to gate bridge concern. Furthermore, three dimensional transistors with fin-type active regions are often desired for enhanced device performance. Those three-dimensional field effect transistors (FETs) formed on fin-type active regions are also referred to as FinFETs. FinFETs are required narrow fin width for short channel control, which leads to smaller top source/drain (S/D) regions than those of planar FETs. This will further degrade the contact to S/D landing margin. Along with the scaling down of the device sizes, the contact or via sizes were continuously shrunk for high-density gate pitch requirement. Various processing approaches are experimented and are not satisfactory, either causing bridging, high contact resistance or patterning issues and manufacturing cost. Therefore, there is a need for a structure and method for forming a contact/via structure to address these concerns for enhanced circuit performance and reliability.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 24 and 25 are sectional views of a semiconductor structure constructed according to some embodiments.

DETAILED DESCRIPTION

Figure 1A:
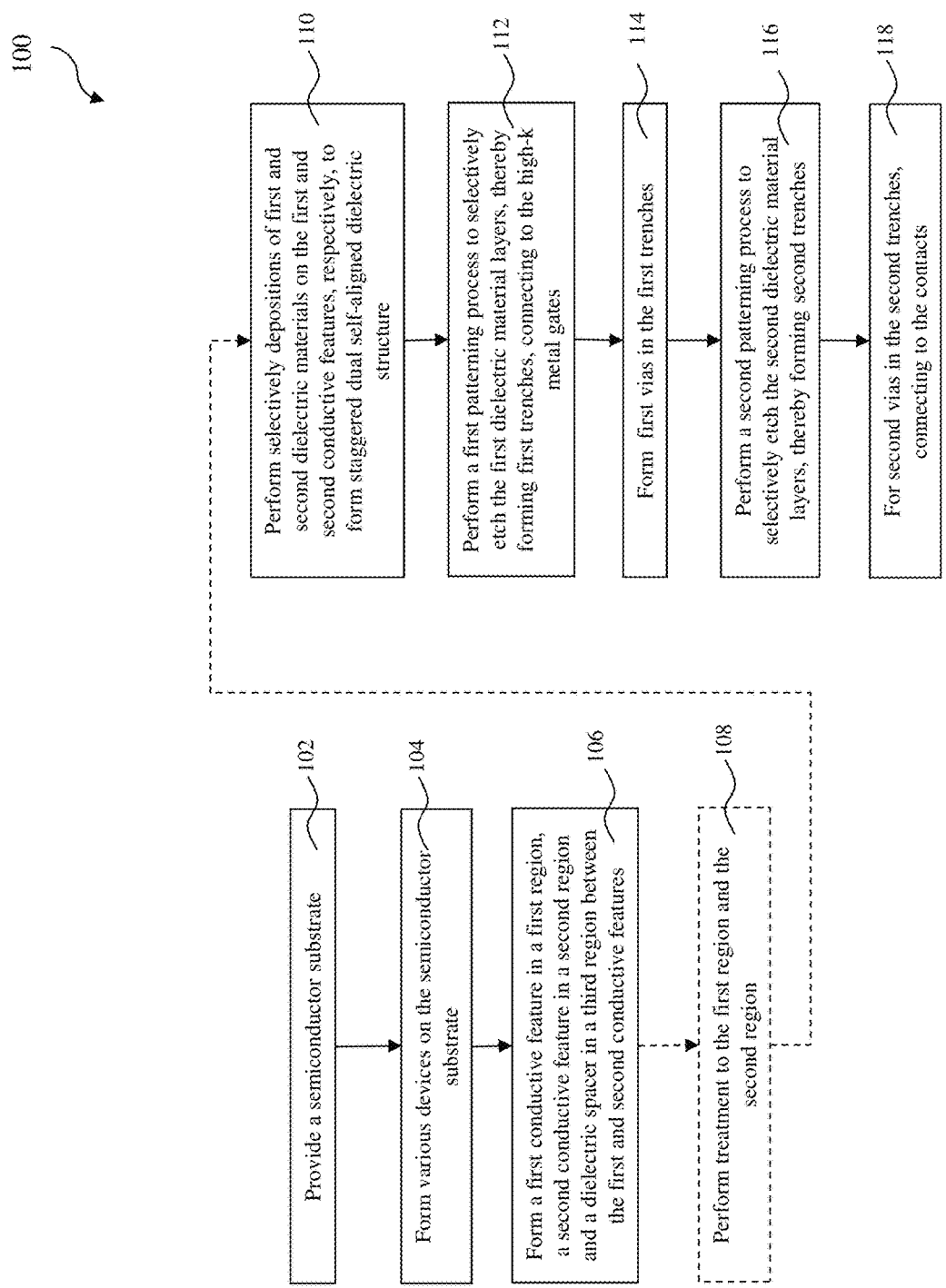
FIGS. 1A and 1B are flowcharts of a method making a semiconductor structure having a staggered self-aligned contact/via structure constructed in accordance with some embodiments.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact and may also include embodiments in which additional features may be formed interposing the first and second features, such that the first and second features may not be in direct contact.

Figure 1B:
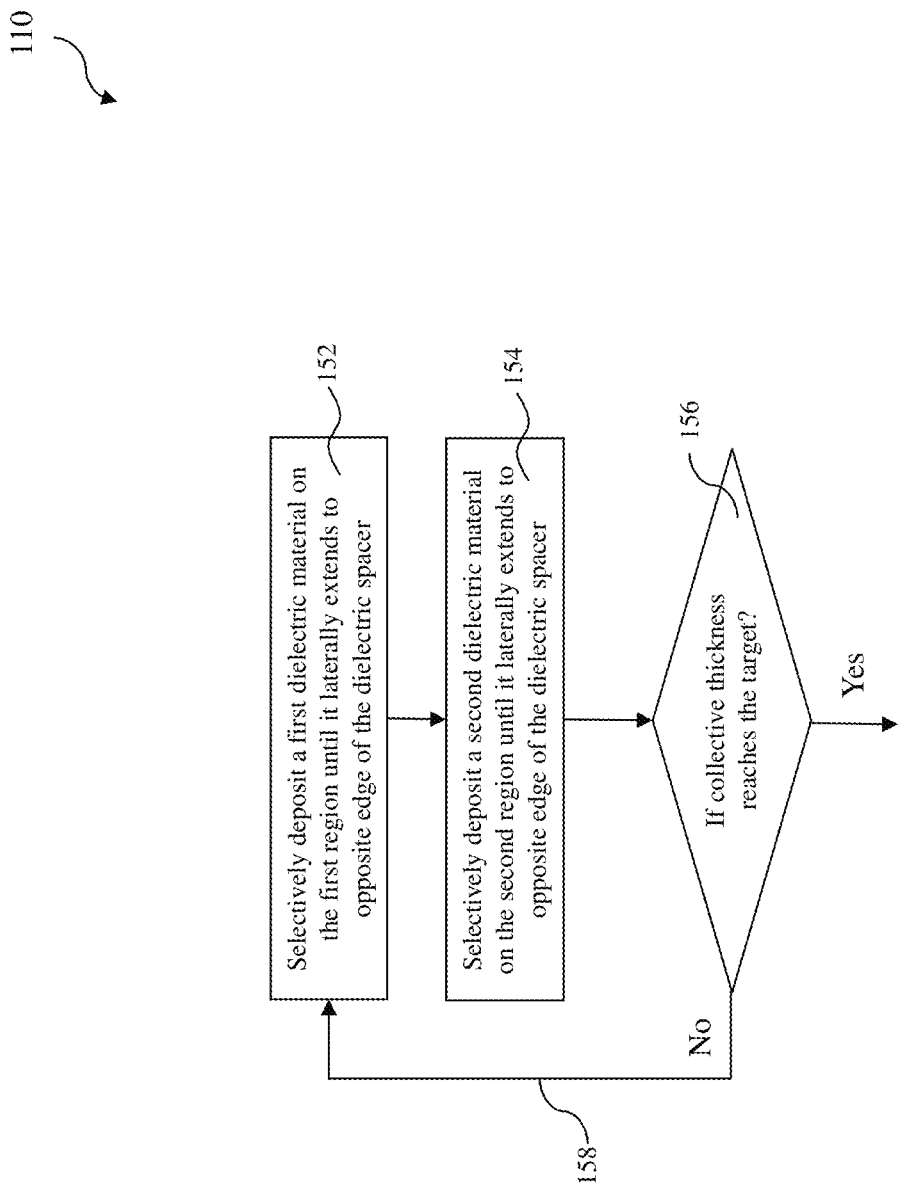

FIGS. 1A and 1B are flowcharts of a method 100 for fabricating an integrated circuit constructed according to some embodiments. FIGS. 2 through 15 are sectional views of an integrated circuit 200 at various fabrication stages. The integrated circuit 200 includes a staggered self-aligned contact/via structure. In some embodiments, the integrated circuit 200 includes fin-type transistors electrically connected through the staggered self-aligned contact/via structure. The semiconductor structure 200 and the method 100 making the same are collectively described below with reference to FIGS. 1A, 1B, and 2 through 15.

Figure 2:
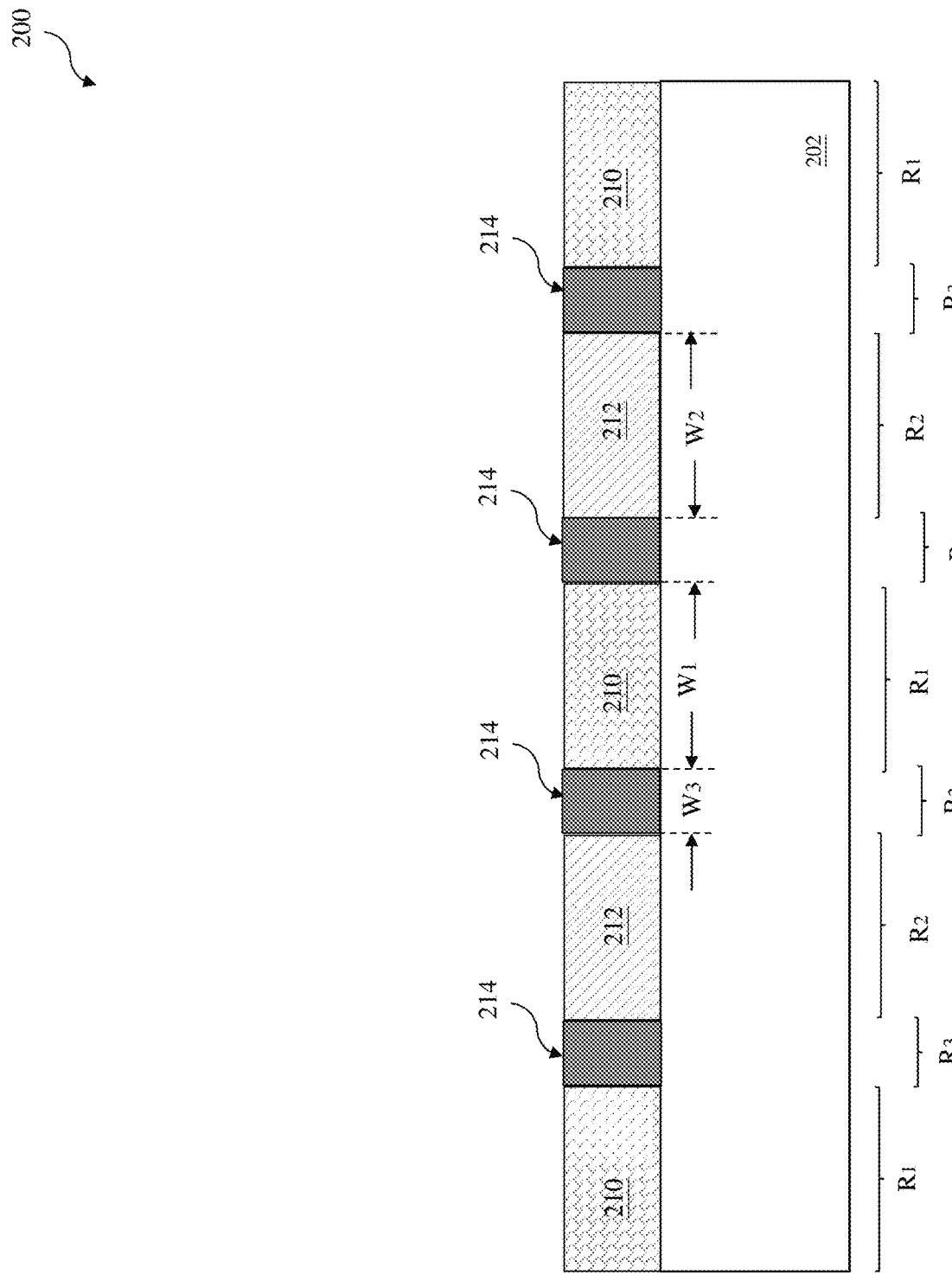
FIGS. 2, 3, 4, 5, 6, 7, 8, 9, 10, 11, 12, 13, 14A, 14B and 15 are sectional views of a semiconductor structure at various fabrication stages constructed according to some embodiments.

Referring to FIG. 1A and FIG. 2, the method 100 begins with a block 102 by providing a semiconductor substrate 202. The semiconductor substrate 202 includes silicon. In some other embodiments, the substrate 202 includes germanium, silicon germanium or other proper semiconductor materials. The substrate 202 may alternatively be made of some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide.

The semiconductor substrate 202 also includes various doped regions such as n-well and p-wells. In one embodiment, the semiconductor substrate 202 includes an epitaxy (or epi) semiconductor layer. In another embodiment, the semiconductor substrate 202 includes a buried dielectric material layer for isolation formed by a proper technology, such as a technology referred to as separation by implanted oxygen (SIMOX). In some embodiments, the substrate 202 may be a semiconductor on insulator, such as silicon on insulator (SOI).

The method 100 includes operations 104 to form various components and devices on the semiconductor substrate 202, such as forming shallow trench isolation (STI) features; forming fin active regions; and forming field-effect transistors (FETs). The operation 104 and the corresponding structures will be further described later.

Still referring to FIG. 2, the method 100 includes an operation 106 to form first conductive features 210 and second conductive features 212 on the substrate 202; and to form dielectric spacers 214 on the substrate 202. Particularly, the dielectric spacers 214 are inserted between the adjacent first conductive features 210 and second conductive features 212 to provide isolation. The dielectric spacers 214 laterally contact the sidewalls of the adjacent conductive features 212 and 210. In some embodiments, the first conductive features 210 are gate electrodes of the corresponding FETs and the second conductive features 212 are contacts to the source/drain (S/D) features of the corresponding FETs. The first conductive features 210 and the second conductive features 212 include metal, metal alloy, silicide, other suitable conductive materials, or a combination thereof. In some embodiments where the first conductive features 210 are gate electrodes, the first conductive features 210 include tungsten, titanium nitride, tantalum nitride, titanium silicon nitride, titanium aluminum carbide or a combination thereof. In some embodiments where the second conductive features 212 are contacts, the second conductive features 212 include cobalt, tungsten, copper, aluminum, ruthenium, or a combination thereof. The gate electrodes are formed by deposition and patterning. In some examples, the gate electrodes are metal gate electrodes and are formed by a gate-last procedure that includes forming dummy gates by deposition and patterning; and removing the dummy gates by etching; forming metal gate electrodes by deposition and polishing, such as chemical mechanical polishing (CMP). The contacts are formed by patterning an interlayer dielectric material to form contact holes; filling a metal in the contact holes by deposition; and CMP. In some embodiments, the dielectric spacers 214 are gate spacers formed on sidewalls of the gate electrodes by deposition and anisotropic etching. The dielectric spacers 214 include one or more suitable dielectric material, such as silicon oxide, silicon nitride, other suitable dielectric material, or combination thereof. The substrate 202 includes three regions: first regions $R_1$ with the first conductive features 210 formed thereon; second regions $R_2$ with the second conductive features 212 formed thereon; and third regions $R_3$ with the dielectric spacers 214 formed thereon. In the embodiments where the first conductive features 210 are gate electrodes and the second conductive features 212 are contacts to the S/D features, the first regions $R_1$ are gate regions and the second regions $R_2$ are contact regions.

A first conductive feature 210 spans a first width $W_1$, a second conductive feature 212 spans a second width $W_2$, and a dielectric spacer 214 spans between the adjacent first conductive feature 210 and the second conductive feature 212 with a third width $W_3$. In some examples, the widths $W_1$, $W_2$, and $W_3$ range between 7 nm and 500 nm, between 5 nm and 500 nm, and between 3 nm and 50 nm, respectively. The height of the first conductive features 210, the second conductive features 212 and the dielectric spacers 214 ranges between 10 nm and 100 nm. When the features sizes are scaled down in advanced technology nodes, the width $W_3$ of the dielectric spacers 214 is scaled down to a small size as well. Various conductive features of the interconnect structure formed on the first and second conductive features 210/212 have much less margins to be properly aligned with the underlying conductive features 210/212, causing short or bridging issues if the misalignment is beyond the tolerable range, which is also scaled-down. On the other side, using etch selectivity to achieve self-aligned process may overcome the issues if three or more different materials are employed, which will increase manufacturing cost and fabrication complexity, not to mention the challenges in choosing dielectric materials and etchants and other issues, such as the gate height loss during all those etching processes. The disclosed method 100 achieves the self-alignment using only two different dielectric materials.

The method 100 may include an operation 108 to perform a treatment to the first conductive features 210, the second conductive features 212, or both to enhance selective depositions in the next operation.

Figure 7:
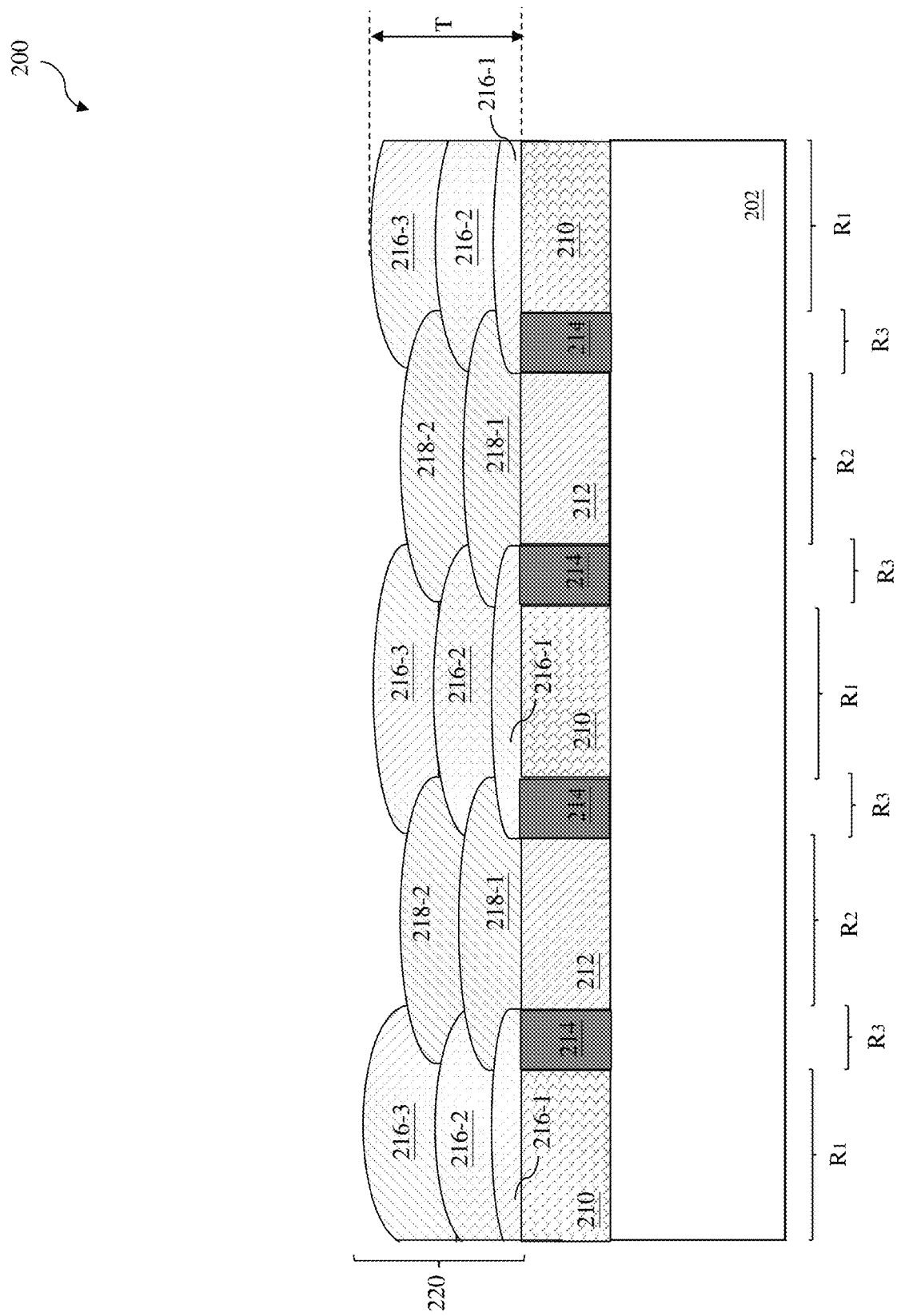
Figure 8:
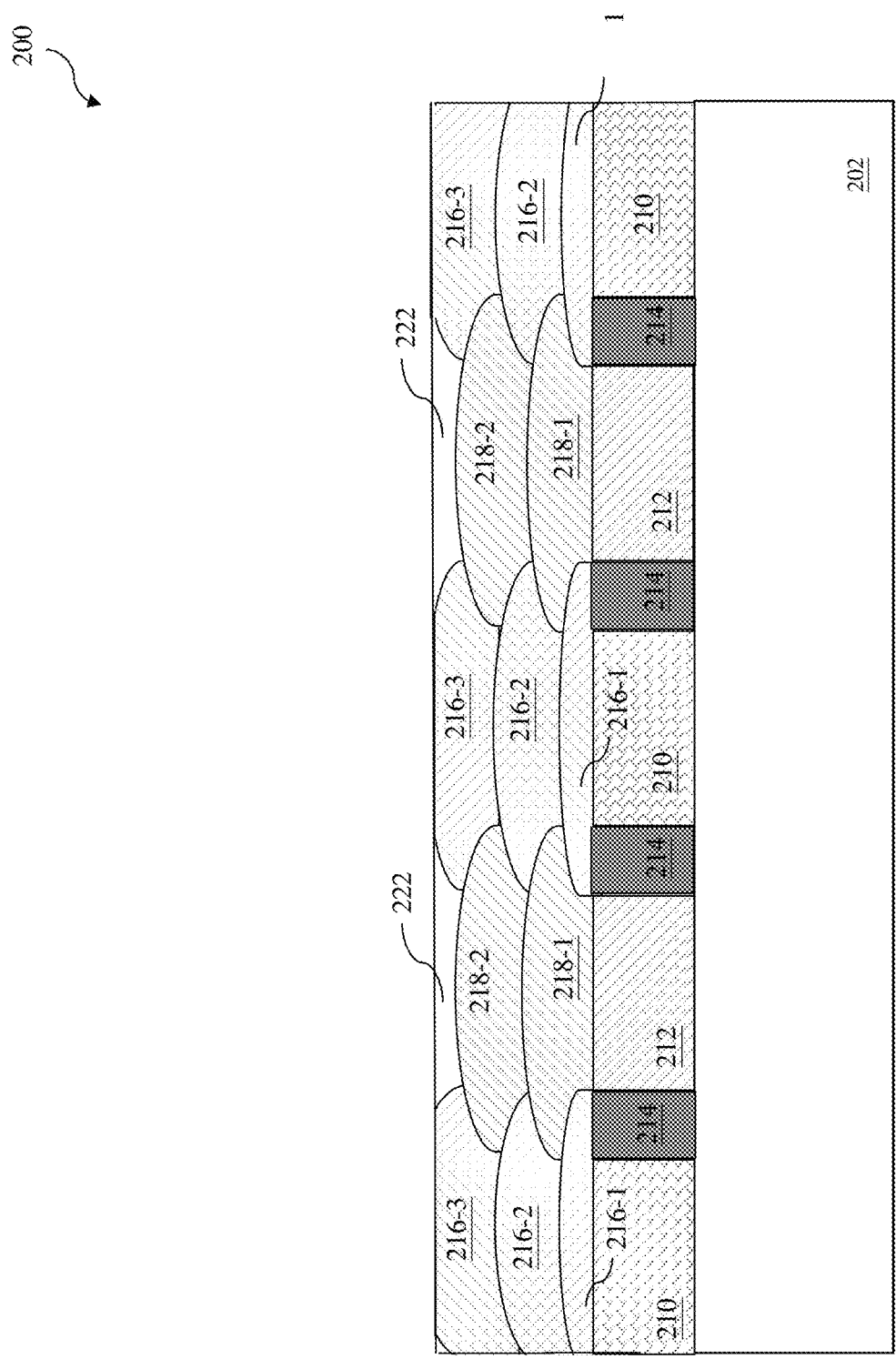

The method 100 includes a procedure 110 to perform selective depositions of first and second dielectric materials on the first conductive features 210 and the second conductive features 212, respectively, thereby forming a staggered dual self-aligned dielectric structure (SDSADS) 220, as illustrated in FIG. 7. The first dielectric material and the second dielectric material are different from each other to have selective depositions and selective etchings during later operations. Furthermore, the dielectric material of the spacers 214 in the third regions $R_3$ are different from the first and second dielectric material in composition for deposition selectivity. More specifically, the SDSADS includes multiple layers of the first dielectric material and multiple layers of the second dielectric material alternatively deposited and interdigitated in the third regions $R_3$. Only the first dielectric material is present within the first regions $R_1$ which are free of the second dielectric material. Similarly, only the second dielectric material is present within the second regions $R_2$ which are free of the first dielectric material, as illustrated in FIG. 7.

The SDSADS 220 is formed by selectively depositions of the first and second dielectric materials alternatively. Specifically, the first dielectric material is selectively deposited within the first regions $R_1$ and the second dielectric material is selectively deposited within the second regions $R_2$. The SDSADS 220 and the procedure 110 to form the same are further described with the reference to FIG. 1B of the procedure 110 and FIGS. 3 through 7 of the semiconductor structure 200.

Figure 3:
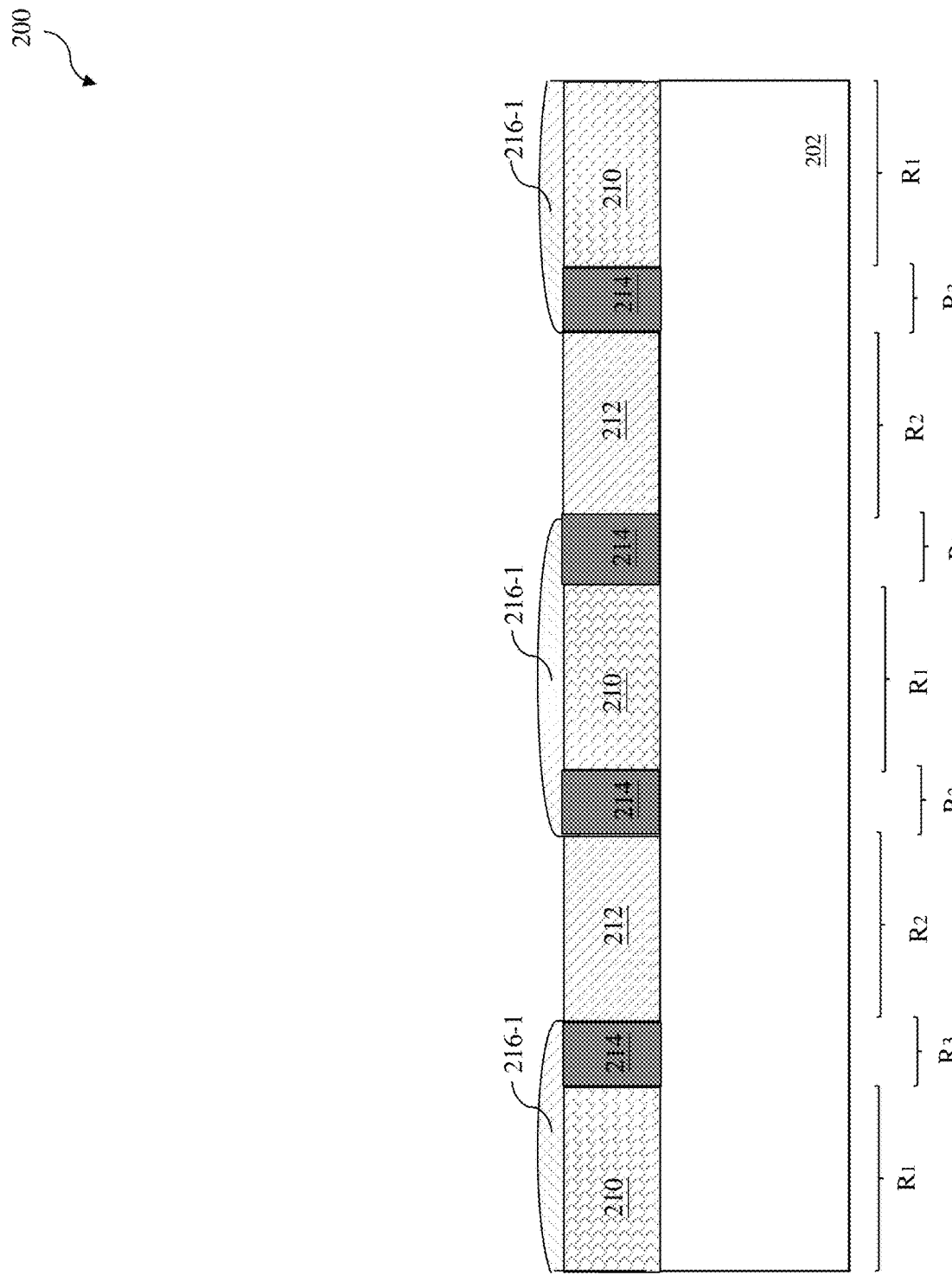

Referring to FIG. 1B and FIG. 3, the procedure 110 includes an operation 152 to selectively deposit a first dielectric material 216-1 within the first regions $R_1$, relative to the second regions $R_2$ and the third regions $R_3$, by a selective deposition process. The first dielectric material is only deposited on the first regions $R_1$ but not on the second regions $R_2$ and the third regions $R_3$. However, during the selective deposition, the first dielectric material laterally extends into the adjacent third regions $R_3$ because the previously deposited first dielectric material serves as new deposition surfaces for subsequent deposition.

Figure 24:
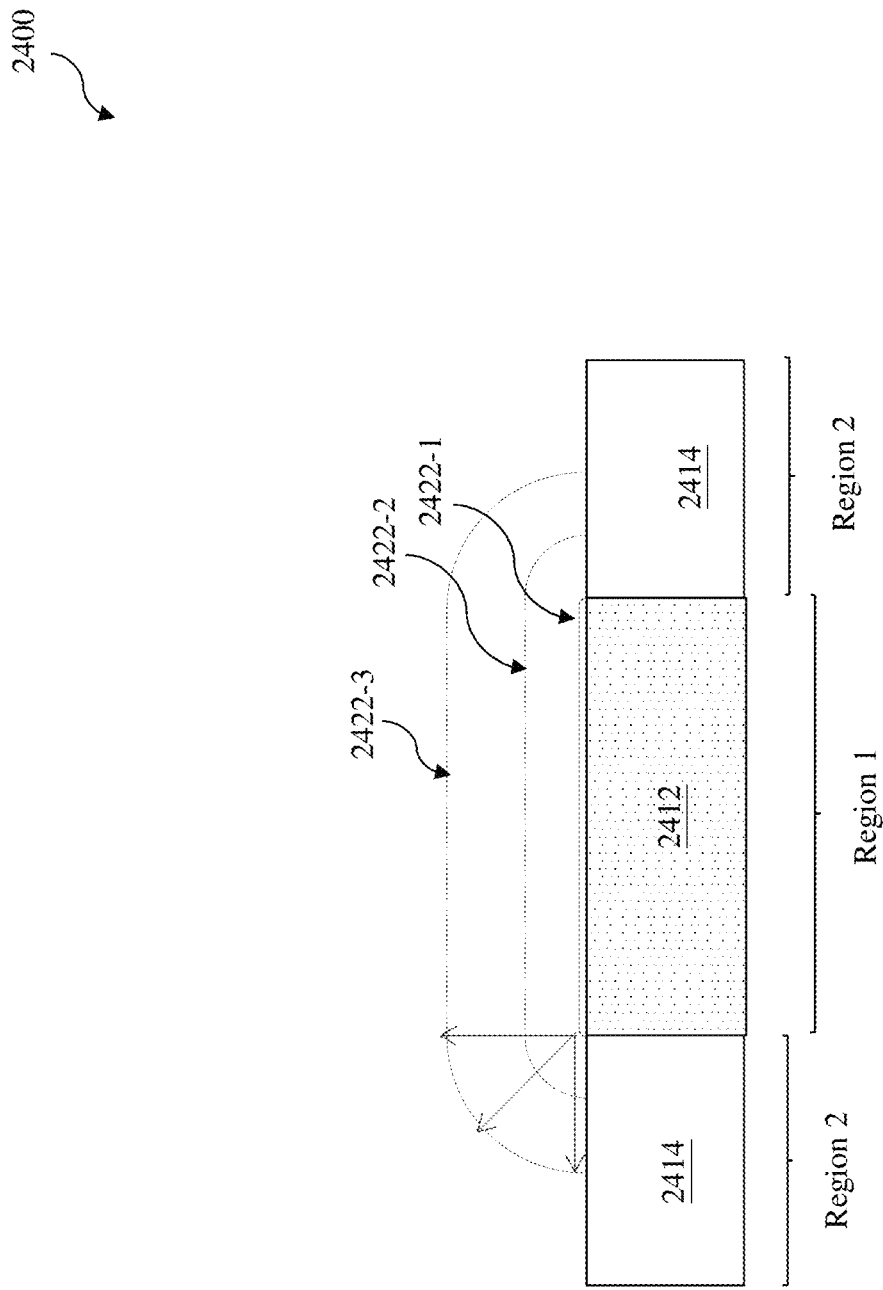

This can be explained with reference to FIG. 24 of a structure 2400 in a sectional view. The structure 2400 includes two regions of different materials on the top surface: a first region ("region 1") of material 2412 and second region ("Region 2") of material 2414. When a selective deposition is applied to the structure 2400, a material 2422 is selectively deposited on the first material 2412 in the first region. The growth front of the deposited material 2422 moves from 2422-1, to 2422-2, 2422-3, etc. Taking the growth front 2422-2 as an example, the growth front 2422-2 includes a top area and side areas. The growth front 2422-2 in the top area provides a surface for further deposition to grow vertically while the growth front 2422-2 in the side areas provide surfaces for further deposition that leads to horizontally extending of the material 2422 into the adjacent second region. In other example, the second regions are treated with inhibitor 2502 to provide selective deposition, as illustrated in FIG. 25. The inhibitor has a particular surface chemistry property, such as hydrophobic vs hydrophilic. In some embodiments, the inhibitor includes a hydrophobic/hydrophilic function group that selectively absorbs on desired non-growth surface to block subsequent growth (such as atomic layer deposition-ALD) thereon. Thus, the subsequent ALD film only selectively grows on the desired surface.

Back to FIG. 3, the growth front of the deposited first dielectric material provides a top surface for further deposition to extend vertically; and the sidewalls surfaces for further deposition that leads to horizontally extending of the first dielectric material into the adjacent third region $R_3$.

The selective deposition in the operation 152 is controlled such that the lateral extension of the first dielectric material reaches the farthermost edge of the adjacent dielectric spacer 214 and fully covers the corresponding third region $R_3$. Thus, the first dielectric material deposited by the operation 152 covers both the first regions $R_1$ and the adjacent third regions $R_3$, as illustrated in FIG. 3. Such formed dielectric layer of the first dielectric material is referred by a numeral 216-1. The selective deposition in the operation 152 includes any suitable deposition technique. In the present embodiment, the selective deposition in the operation 152 includes atomic layer deposition (ALD) tuned to have deposition selectivity, with mechanism described above, such as with inhibitor. In some embodiments, to protect the inhibitor on the non-growth surface, the ALD process is tuned to have a deposition temperature less than 350° C., to avoid destructing the inhibitor film absorbing on the non-growth surface. The deposited first dielectric material 216-1 also serves as new deposition surfaces for subsequent deposition.

Figure 4:
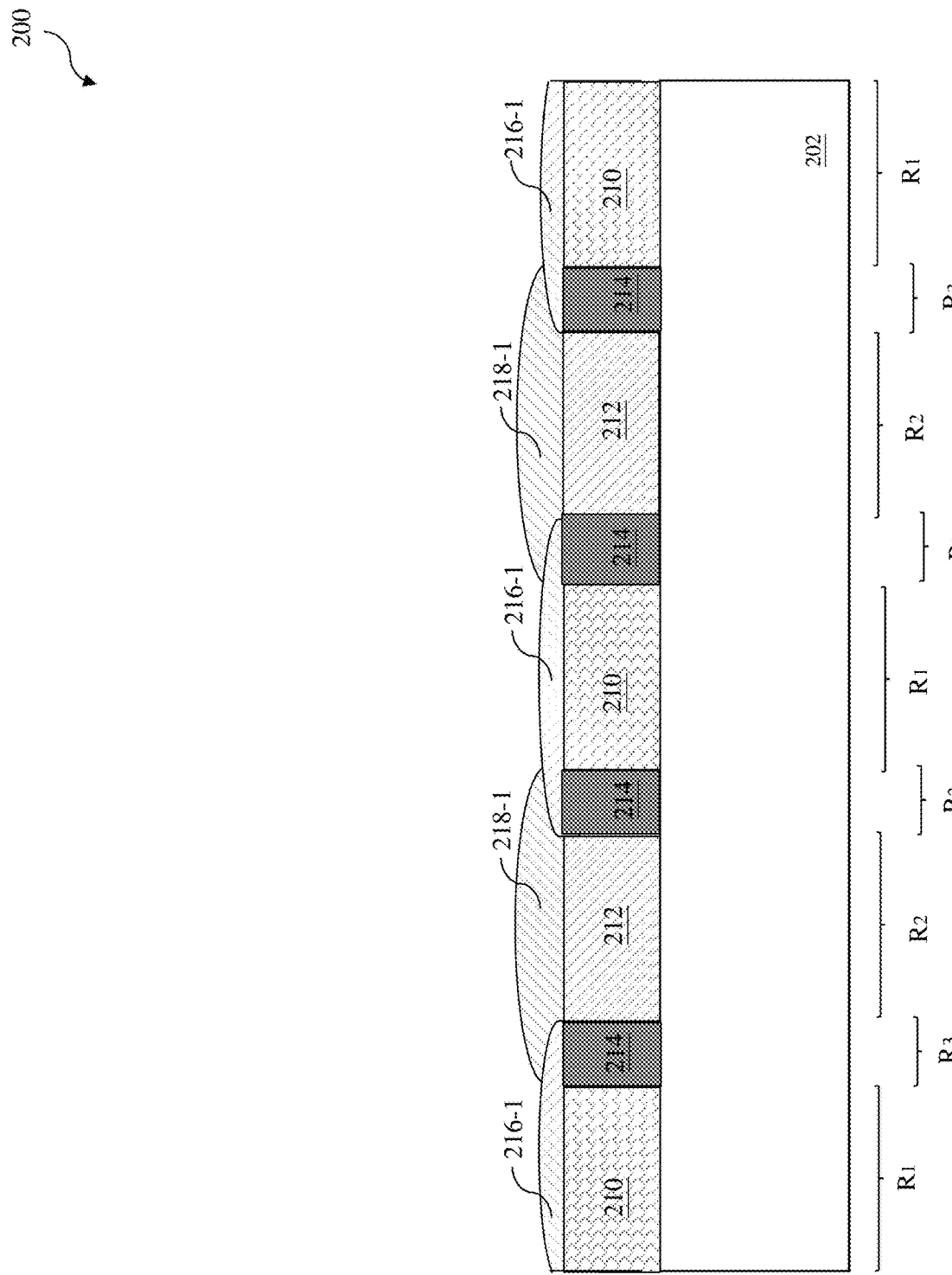

Referring to FIG. 1B and FIG. 4, the procedure 110 further includes an operation 154 to selectively deposit a second dielectric material 218-1 within the second regions $R_2$, relative to the first regions $R_1$ and the third regions $R_3$, by another selective deposition process. The second dielectric material is deposited only on the second regions $R_2$, not on the first regions $R_1$ and the third regions $R_3$. However, during the selective deposition, the second dielectric material laterally extends into the adjacent third regions $R_3$ for the similar reason described above. The selective deposition in the operation 154 is controlled such that the lateral extension of the second dielectric material reaches the farthermost edge of the adjacent dielectric spacer 214 and fully covers the corresponding third region $R_3$. Thus, the second dielectric material deposited by the operation 154 covers both the second regions $R_2$ and the adjacent third regions $R_3$, as illustrated in FIG. 4. Such formed dielectric layer of the second dielectric material is referred by a numeral 218-1. The selective deposition in the operation 154 includes any suitable deposition technique. In the present embodiment, the selective deposition in the operation 154 includes ALD tuned to have deposition selectivity. In some embodiments, the ALD process is tuned to have a deposition temperature less than 350° C., to ensure the inhibitor film absorbing on the non-growth surface.

The first dielectric material and the second dielectric material are different in composition for selective deposition and selective etching. In some example, the first dielectric material includes silicon oxide, silicon nitride, silicon oxynitride, silicon carbonitride, silicon carbon oxynitride, silicon carbide, or metal oxide (e.g., hafnium oxide, zirconium oxide, lanthanum oxide, and aluminum oxide), or a combination thereof. The second dielectric material is also chosen from the group but is chosen to be different from the first dielectric material. For example, the first dielectric material is metal oxide, and the second dielectric material is silicon nitride. In another example, the first dielectric material is a silicon-containing dielectric material (such as silicon oxide, silicon nitride and silicon oxynitride) and the second dielectric material is a metal-containing dielectric material (such as hafnium oxide, zirconium oxide, lanthanum oxide, and aluminum oxide). The dielectric material of the spacers 214 is different from both the first and second dielectric materials for deposition selectivity. For example, the first dielectric material includes metal oxide, the second dielectric material includes silicon nitride and the dielectric material of the spacers 214 includes silicon oxide.

Figure 5:
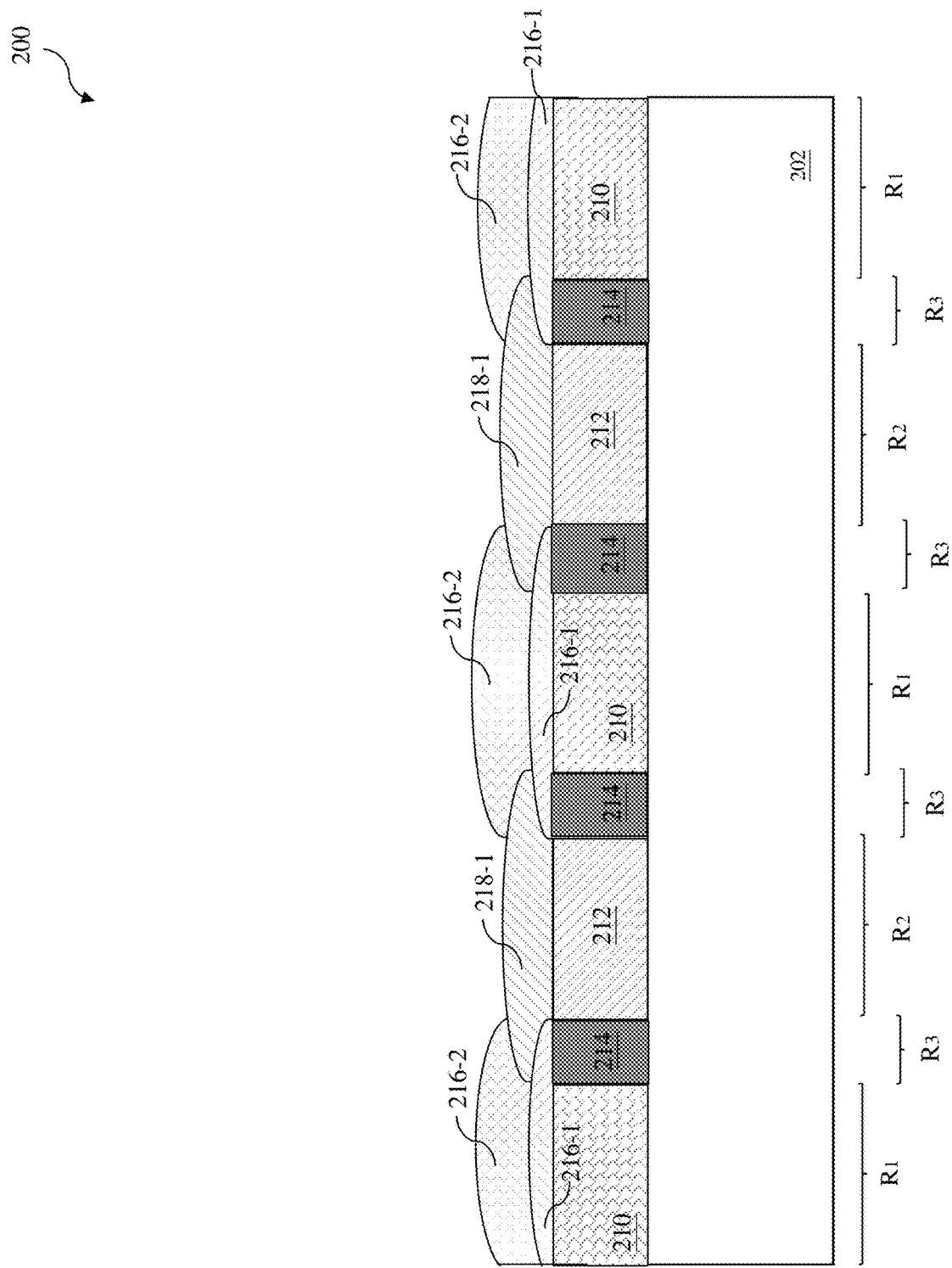
Figure 6:
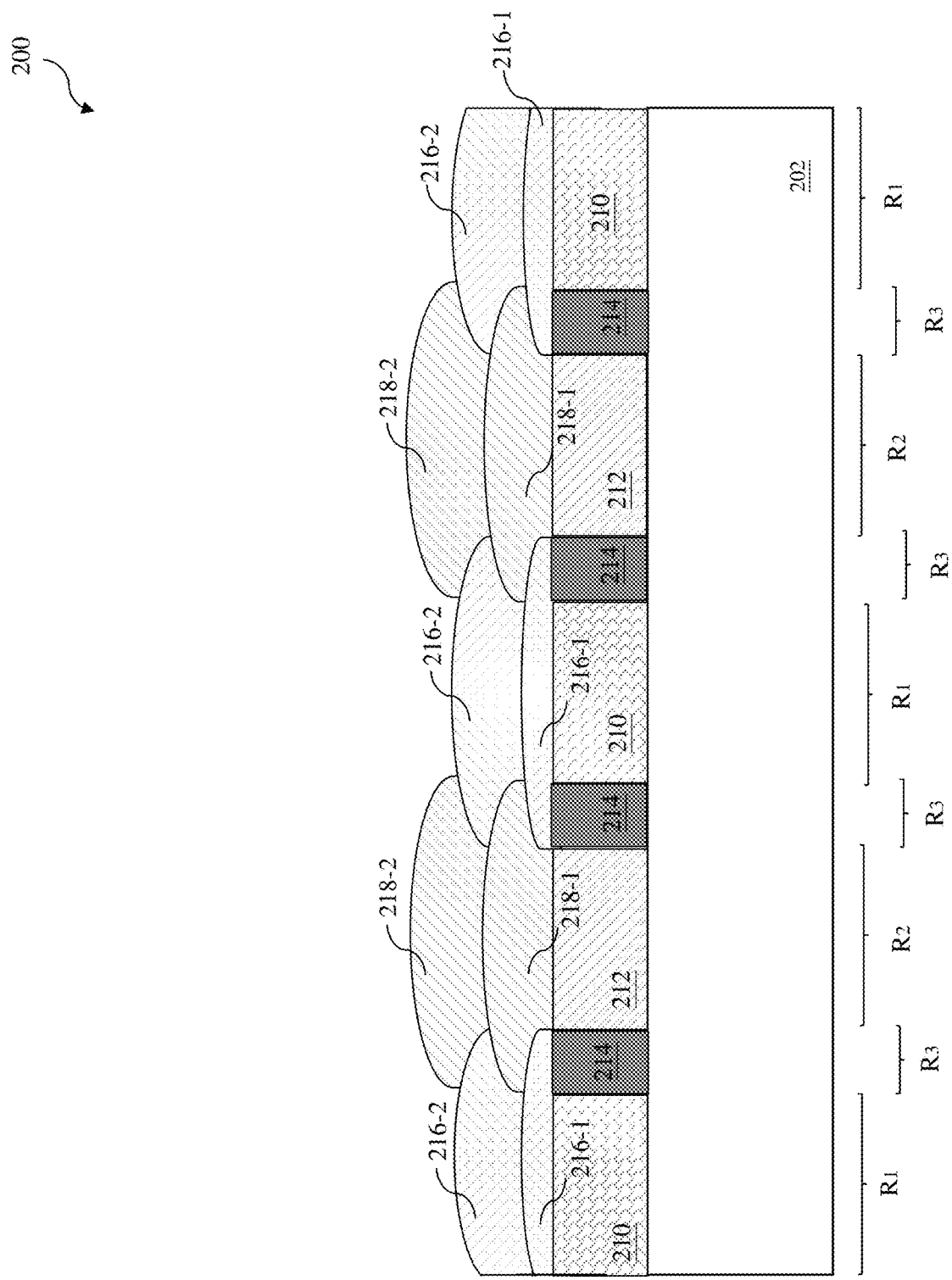

The operations 152 and 154 are repeated multiple cycles to deposit the first dielectric material and the second dielectric material alternatively, thereby forming a SDSADS 220 with a collective thickness reaching a targeted thickness. Specifically, in an $i^{th}$ cycle, by the operation 152, the first dielectric material is selectively deposited in the first regions $R_1$ and extends laterally to the adjacent third regions $R_3$, referred to as first dielectric layer 216-$i$; and then, by the operation 154, the second dielectric material is deposited in the second regions $R_2$ and extends laterally to the adjacent third regions $R_3$, referred to as second dielectric layer 218-$i$. For example, another first dielectric layer 216-2 is deposited in the first regions $R_1$ and extends to the third regions $R_3$ as illustrated in FIG. 5; another second dielectric layer 218-2 is deposited in the second regions $R_2$ and extends to the third regions $R_3$ as illustrated in FIG. 6; another first dielectric layer 216-3 is deposited in the first regions $R_1$ and extends to the third regions $R_3$, and so on to form the SDSADS 220, as illustrated in FIG. 7. The alternative depositions 152 and 154 continue until the collective thickness T of the SDSADS 220 reaches the target thickness, such as the desired thickness to form vias in the SDSADS 220. The procedure 110 may include a block 156 to determine if the collective thickness T reaches the target. If not, go back to repeat (158) the operations 152 and 154. If yes, the procedure 110 is completed with the formed SDSADS 220. FIG. 7 only illustrates exemplary first dielectric layers (216-1, 216-2, 216-3, and . . . ) and the second dielectric layers (218-1, 218-2, and . . . ). The real numbers of the first dielectric layers and the second dielectric layers depends on the targeted thickness T. The first dielectric layers include $N_1$ layers: 216-1, 216-2, . . . and 216-$N_1$. The second dielectric layers include $N_2$ layers: 218-1, 218-2, . . . and 218-$N_2$. Both $N_1$ and $N_2$ are greater than 2, such as between 5 and 10. In some embodiments, at least one of $N_1$ and $N_2$ is 2 or greater than 2 and the another is 1 or great than 1. Such formed SDSADS 220 includes three portions, the first regions $R_1$ having only the first dielectric material, the second regions $R_2$ having only the second dielectric material; and the third regions $R_3$ having both the first and second dielectric materials interdigitated. Alternatively, the procedure 110 may have a different sequence, such as beginning at the operation 154, then the operation 152, and repeats the operations 154 and 152 until the SDSADS 220 reaches the targeted thickness.

To form the SDSADS 220, the operations 152 and 154 are tuned to achieve selective depositions, as described above. The selective deposition depends on many factors including deposition process, deposited dielectric material compositions and deposition surface. Accordingly, the selective deposition process can be tuned by choosing a combination of the deposition process, compositions of the first and second dielectric materials and deposition surface. In some embodiments, the method 100 includes, prior to the procedure 110, an operation 108 to treat or modify the first regions $R_1$, the second regions $R_2$, or both to provide surfaces with deposition selectivity.

Referring back to FIG. 1A and FIG. 8, the method 100 may include an operation to form an inter-layer dielectric (ILD) layer 222 that includes one or more suitable dielectric material, such as silicon oxide, silicon nitride, low-k dielectric material, other suitable dielectric material, or a combination thereof. For example, an ILD layer is deposited by a suitable deposition technique, such as chemical vapor deposition (CVD), and then a CMP process is applied to recess and planarize the top surface.

Figure 9:
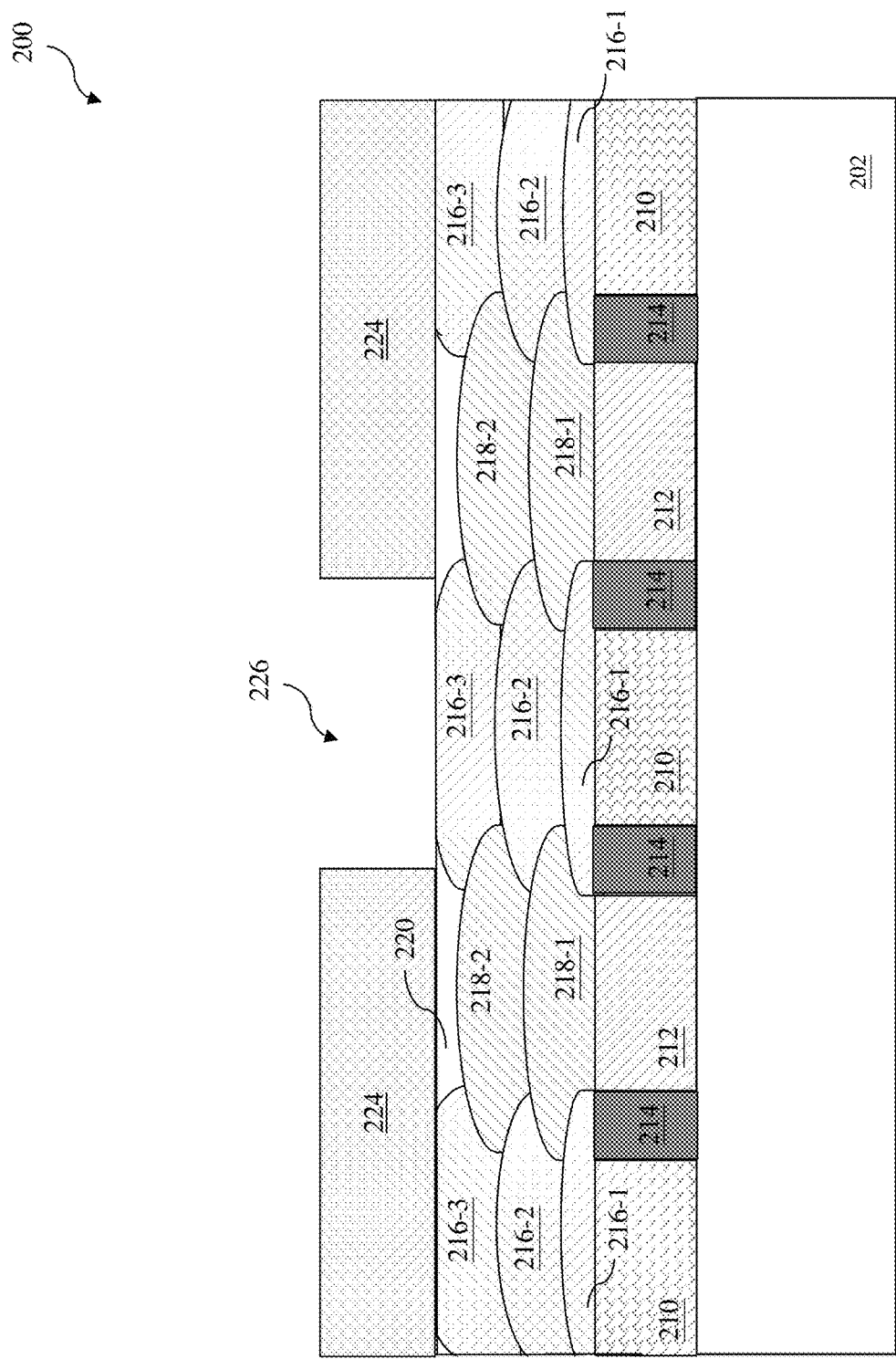
Figure 10:
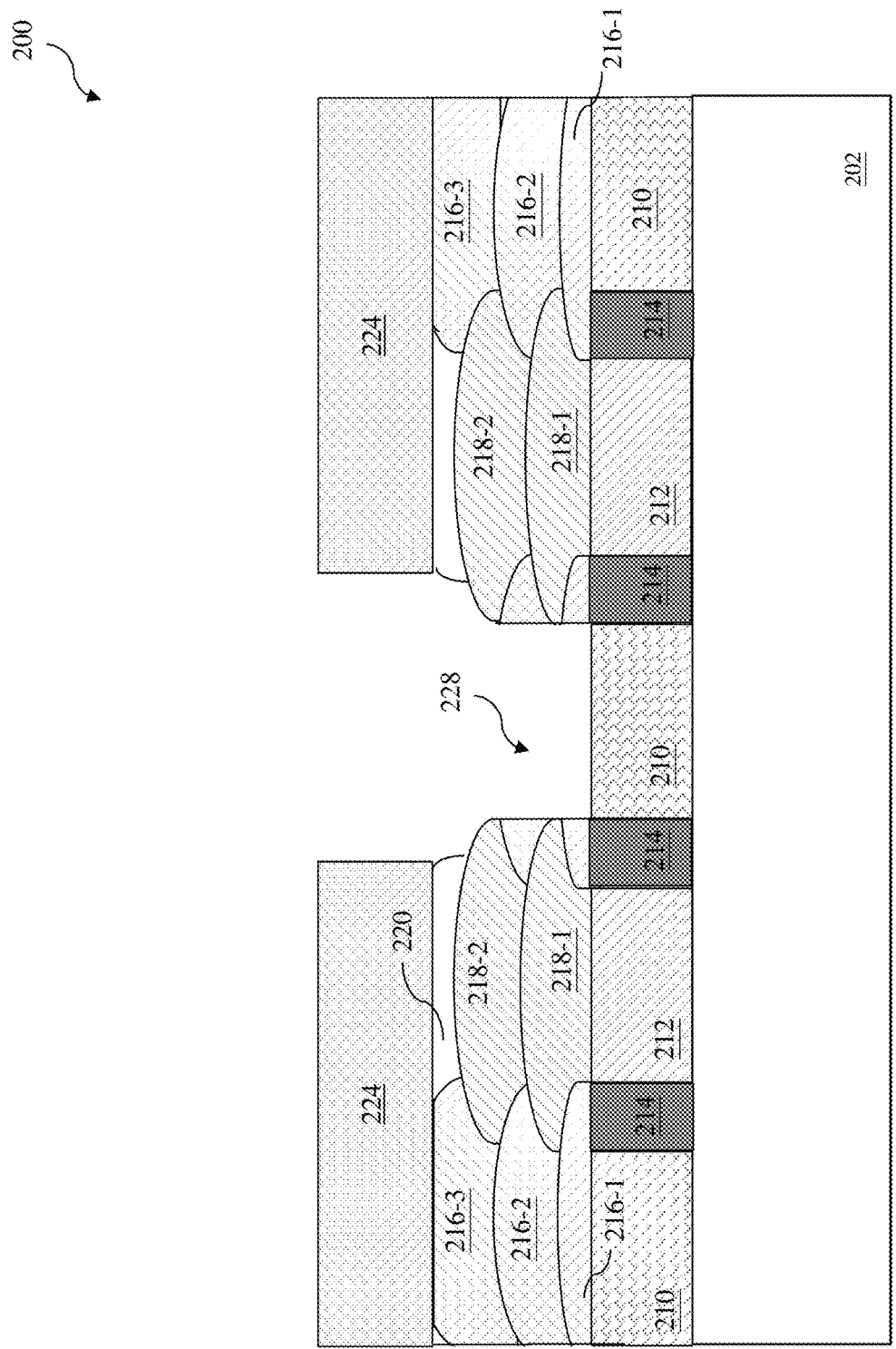

Referring to FIGS. 1A, 9 and 10, the method 100 proceeds to an operation 112 to perform a first patterning process to selectively etch the first dielectric material (the first dielectric materials layers 216-1, 216-2, etc.) relative to the second dielectric material (the second dielectric materials layers 218-1, 218-2, etc.). The first patterning process may include forming a first mask 224 with one or more opening 226 to expose the first region $R_1$ to be etched, as illustrated in FIG. 9. The opening 226 of the first mask 224 is not necessarily aligned exactly with the first dielectric material in one of the first regions $R_1$ due to the etching selectivity between the first and second dielectric materials. Thus, even various dimensions/sizes are scaled down with limited alignment margins, the disclosed method overcomes the previously described issues by the self-aligned etching. The first mask 224 may be a patterned photoresist layer formed by a lithography process that includes spin coating, exposure and developing. Alternatively, the first mask 224 may be a hard mask formed by a lithography process and etching that transfers the opening from a photoresist layer to the hard mask.

Then a first selective etching process is applied to the semiconductor structure 200 to selectively etch the first dielectric material, thereby forming a trench 228 in the SDSADS 220, as illustrated in FIG. 10. The first conductive feature 210 is exposed within the first trench 228. The second dielectric material, even exposed in the opening 226, survives through the selective etching process. The staggered portions of the SDSADS 220 within the third regions $R_3$ also substantially survive even being exposed within the opening 226. This is because that the staggered portions include the first and second dielectric materials being interdigitated, and the first dielectric material layers covered by the second dielectric material are protected from etching. The first selective etching process may include an anisotropic etching process, such as a plasma etch, with an etchant to selectively etch the first dielectric material. Alternatively, the first selective etching process may include a dry etch, a wet etch, or a combination thereof, with etchant(s) that selectively removes the first dielectric material.

Figure 11:
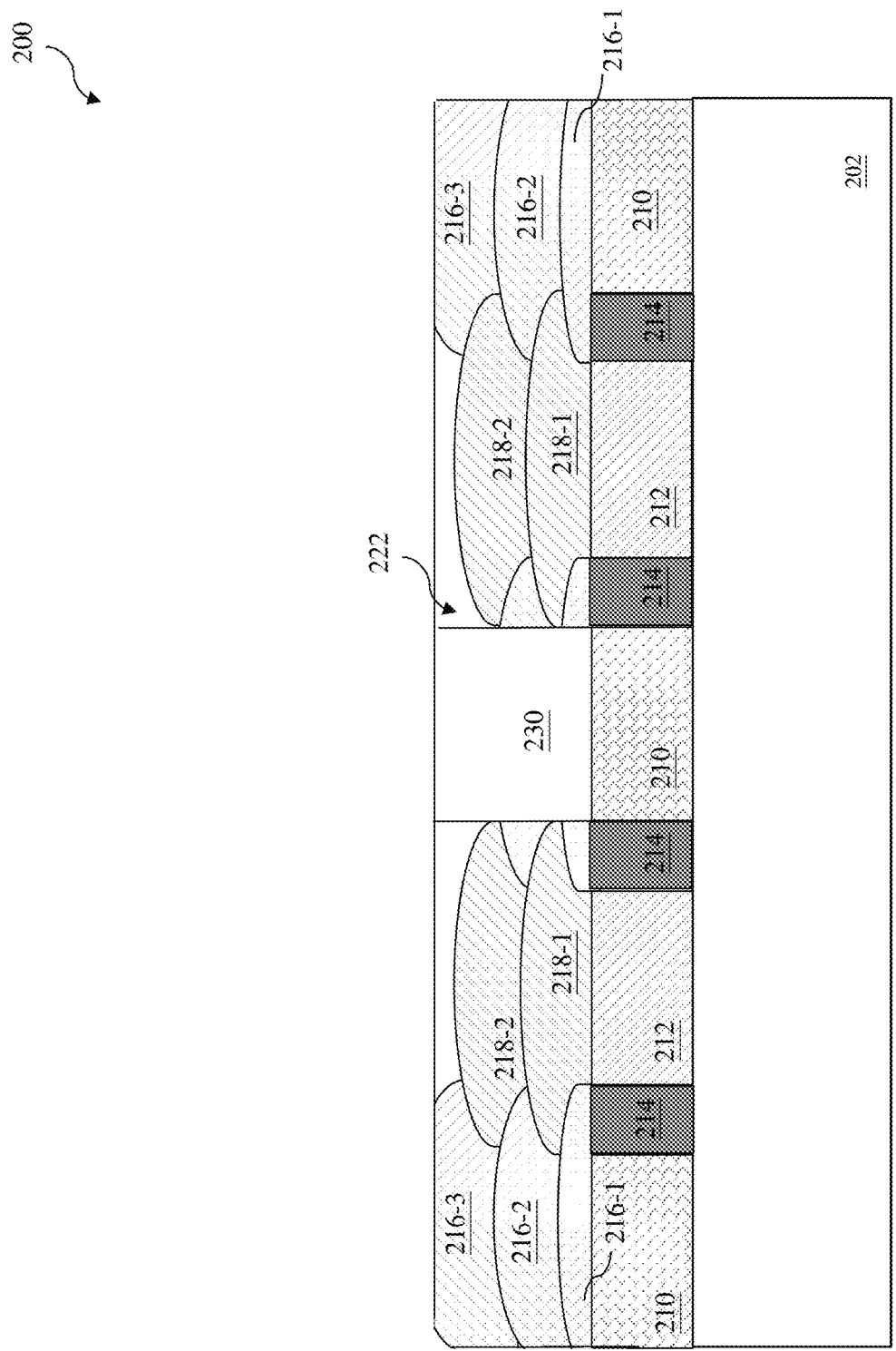

Referring to FIGS. 1A and 11, the method 100 proceeds to an operation 114 to form a first via 230 in the first trench 228. The first via 230 is a conductive feature and is directly landing on the first conductive feature 210 as portions of the interconnect structure. The first via 230 may include metal, metal alloy, other suitable conductive material, or a combination thereof. In some examples, the first via 230 includes cobalt, tungsten, ruthenium, copper, aluminum, or a combination thereof. The first via 230 may include two or more films, such as a barrier layer and a filling conductive material. The operation 114 includes a deposition process with a suitable technique, such as CVD, PVD, ALD, plating, other suitable deposition or a combination thereof. The operation 114 may further include a CMP process to remove portions deposited on the SDSADS 220 and planarize the top surface. The first mask 224 is removed afterward by the CMP, a proper removal method, such as wet etch, or a combination thereof.

Figure 12:
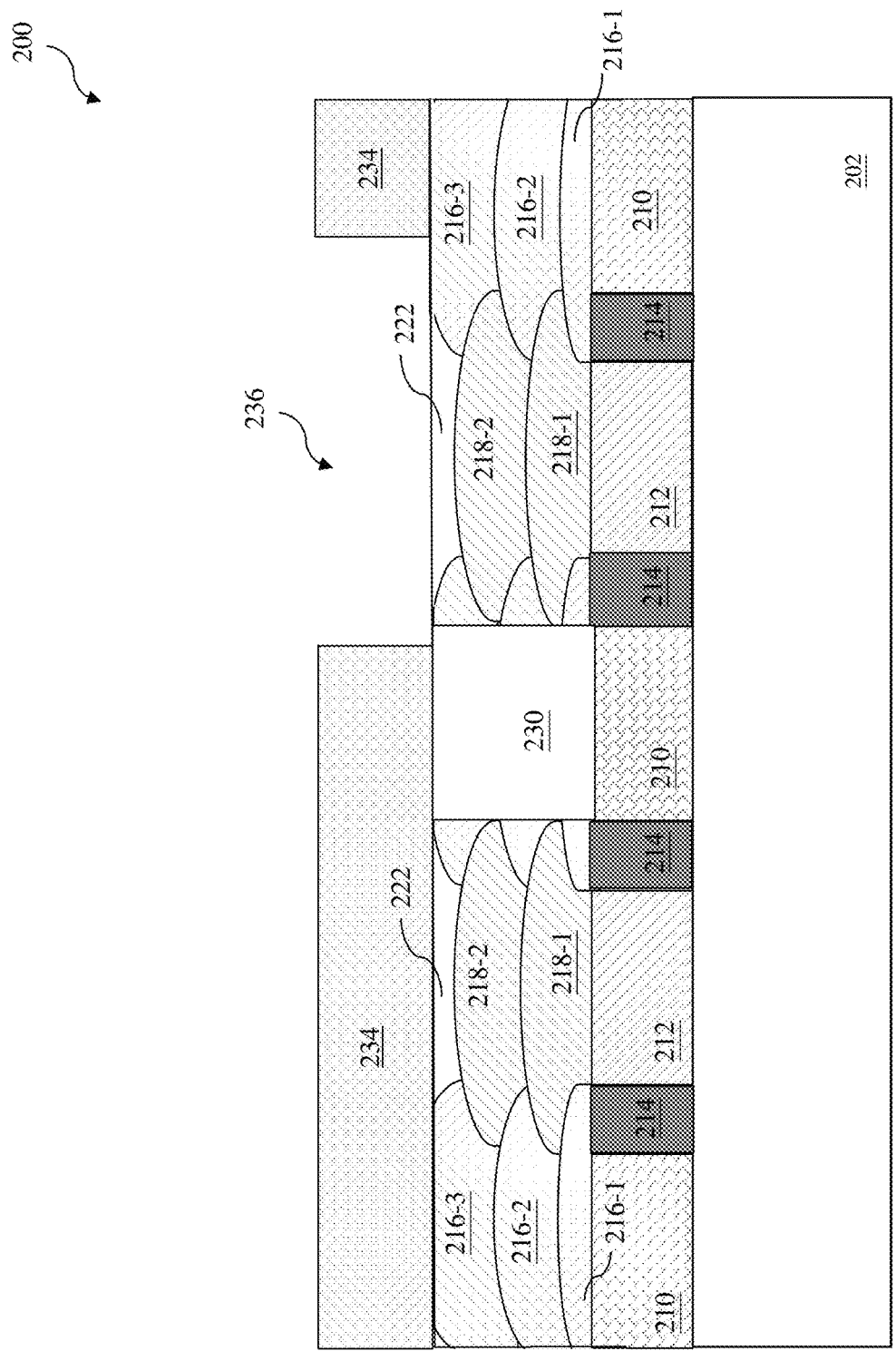
Figure 13:
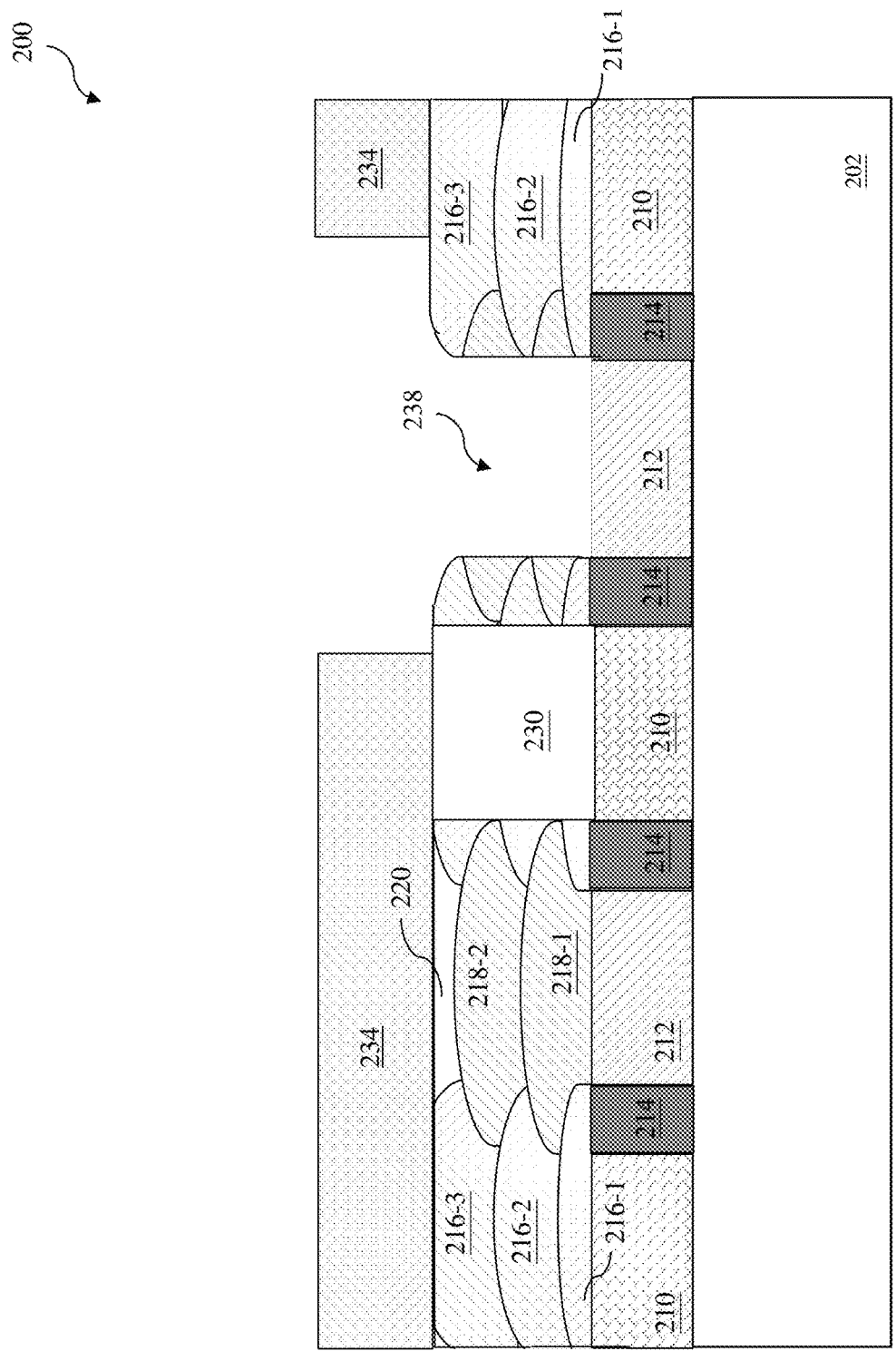

Referring to FIGS. 1A, 12 and 13, the method 100 also includes an operation 116 to perform a second patterning process to selectively etch the second dielectric material (the second dielectric materials layers 218-1, 218-2, etc.) relative to the first dielectric material (the first dielectric materials layers 216-1, 216-2, etc.). The second patterning process may include forming a second mask 234 with one or more opening 236 to expose the second region $R_2$ to be etched, as illustrated in FIG. 12. For the similar reason, the opening 236 of the second mask 234 is not necessarily aligned exactly with the second dielectric material in one of the second regions $R_2$ due to etching selectivity between the first and second dielectric materials. The second mask 234 may be a patterned photoresist layer formed by a lithography process, or a patterned hard mask formed by a lithography process and etching.

Then a second selective etching process is applied to the semiconductor structure 200 to selectively etch the second dielectric material, thereby forming a trench 238 in the SDSADS 220, as illustrated in FIG. 13. The first dielectric material, even exposed in the opening 236, survives during the selective etching process. The staggered portions of the SDSADS 220 within the third regions $R_3$ also substantially survive, even exposed within the opening 236 because the staggered portions include the first and second dielectric materials being interdigitated, and the second dielectric material layers covered by the first dielectric material are protected from etching. The second selective etching process may include an anisotropic etching process, such as a plasma etch, with an etchant to selectively etch the second dielectric material. Alternatively, the second selective etching process may include a dry etch, a wet etch, or a combination thereof, with etchant(s) that selectively removes the second dielectric material. The etchant used in the second selective etching process is different from that used in the first selective etching process. For example, the first dielectric material is a metal oxide (such as hafnium oxide, zirconium oxide, lanthanum oxide, aluminum oxide, or a combination thereof) and the second dielectric material is silicon nitride. The first etchant used in the first selective etching process includes chlorine (Cl) or $BCl_3$ to etch metal oxide and stop on silicon nitride, while the second etchant used in the second selective etching process includes $CH_3F$ to etch silicon nitride and stop on metal oxide.

Figure 14A:
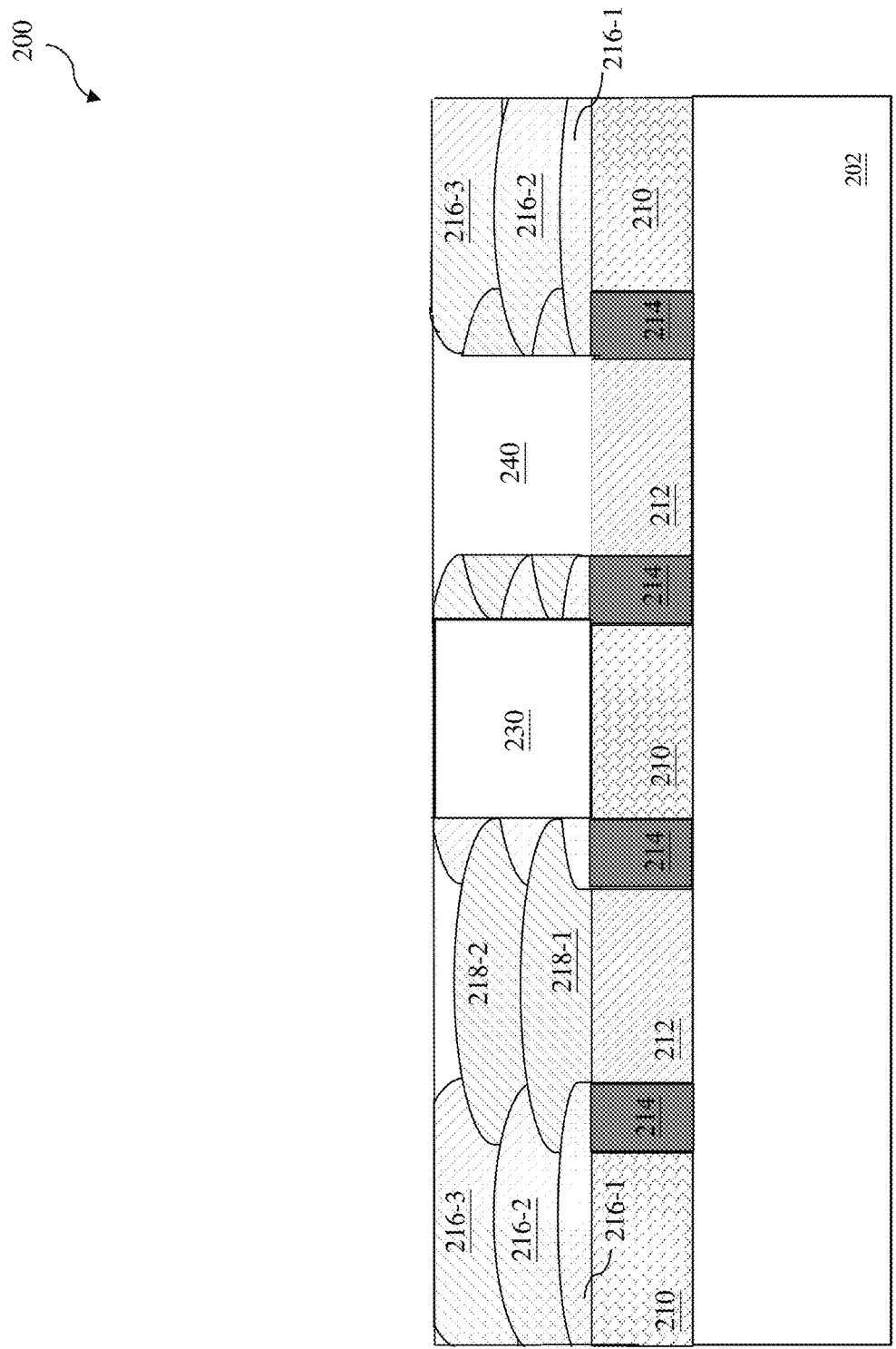

Referring to FIGS. 1A and 14A, the method 100 proceeds to an operation 118 to form a second via 240 in the second trench 238. The second via 240 is a conductive feature and is directly landing on the second conductive feature 212 as portions of the interconnect structure. The second via 240 may include metal, metal alloy, other suitable conductive material, or a combination thereof. In some examples, the second via 240 includes cobalt, tungsten, ruthenium, copper, aluminum, or a combination thereof. The second via 240 may include two or more films, such as a barrier layer and a filling conductive material. The operation 118 includes a deposition process with a suitable technique, such as CVD, PVD, ALD, plating, other suitable deposition or a combination thereof. The operation 118 may further include a CMP process to remove portions deposited on the SDSADS 220 and planarize the top surface. The second mask 234 may be removed afterward by the CMP, a proper removal method, such as wet etch, or a combination thereof.

Figure 14B:
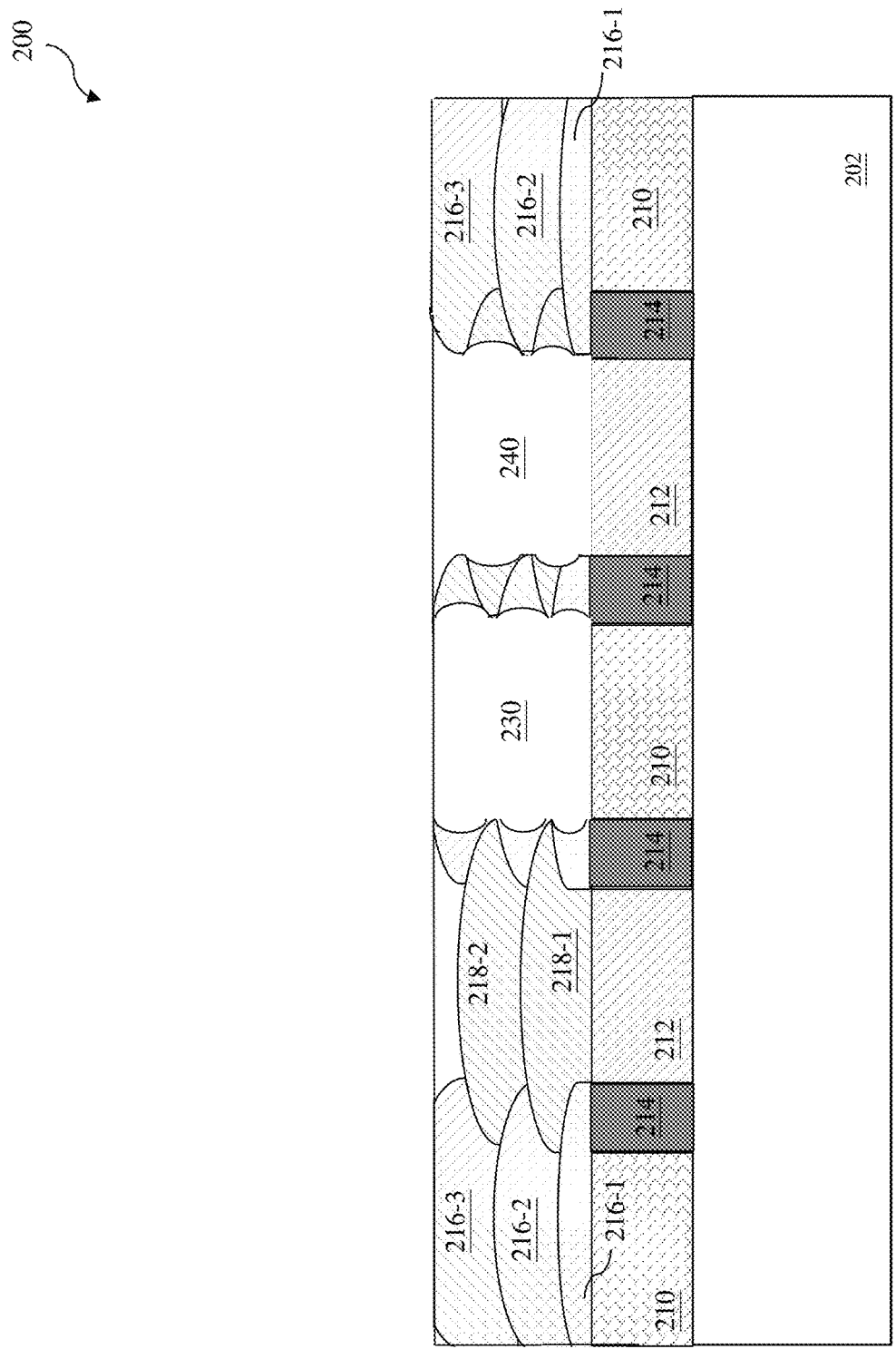

In some embodiments, thus formed conductive features (the first via 230 and the second via 240) have uneven sidewalls as illustrated in FIG. 14B. Due to the lateral etching effects of the first patterning process to selectively etch the first dielectric material layers at the operation 112 and the second patterning process to selectively etch the second dielectric material layers at the operation 116, the corresponding dielectric material layers are laterally etched, resulting in the first trench 228 with the first dielectric material layers laterally recessed and/or the second trench 238 with the second dielectric material layers laterally recessed. Accordingly, thus formed conductive features (the first via 230 and the second via 240) have sidewalls with sinuous profiles.

Figure 15:
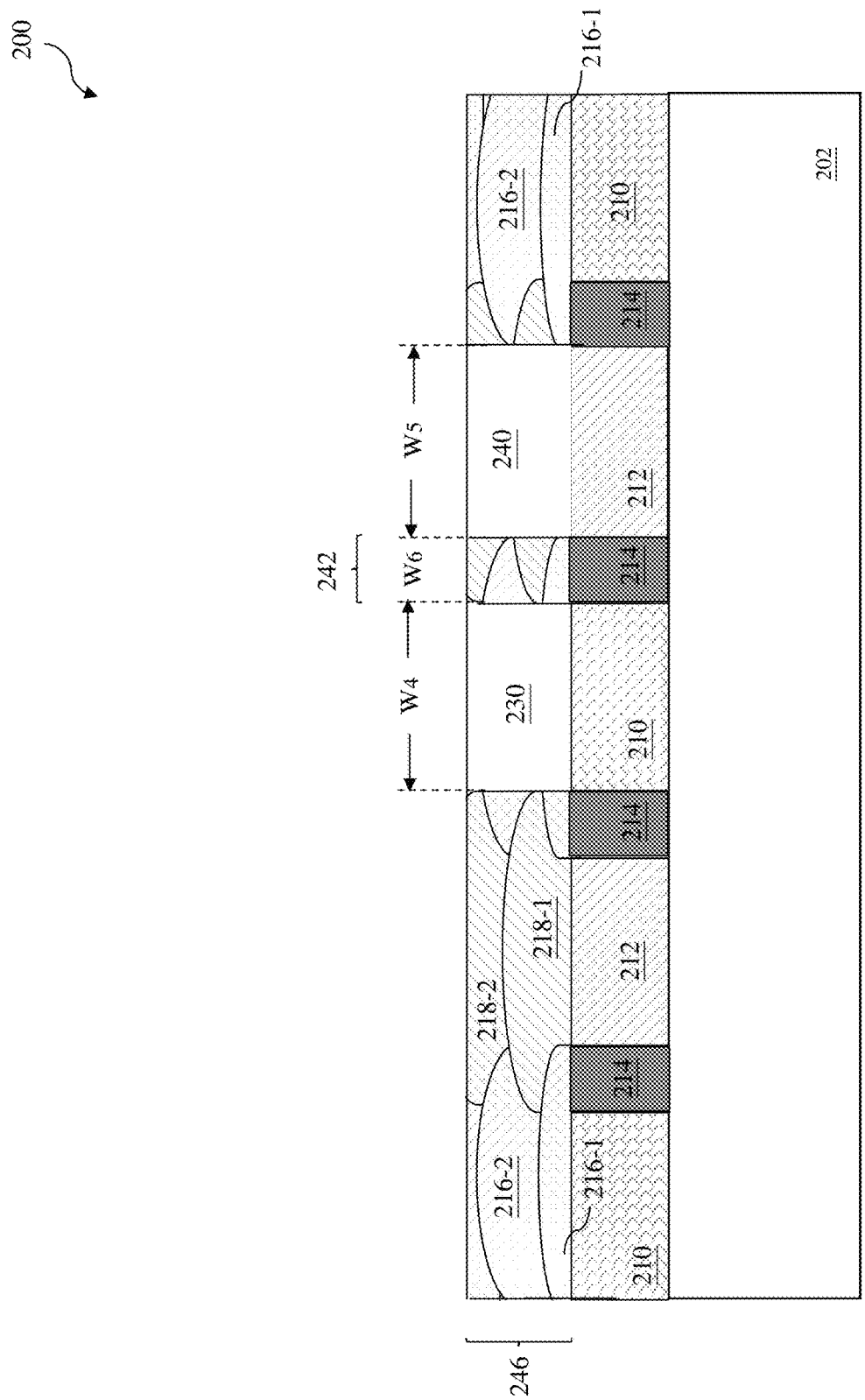

Alternatively, the SDSADS 220 is initially formed thicker than the desired thickness, a top portion of the SDSADS 220 is then removed by CMP to form the first via 230 and the second via 240 with improved shape and profile, as illustrated in FIG. 15. Such formed SDSADS 220 and the vias 230/240 are collectively referred to as a staggered self-aligned contact/via structure 246 with the desired thickness.

In the staggered self-aligned contact/via structure, the first via 230 spans a fourth width $W_4$, the second via 240 spans a fifth width $W_5$, and the staggered dielectric spacer 242 spans a sixth width $W_6$ between the first via 230 and the second via 240. By the disclosed method, those widths can achieve smaller dimensions. For examples, the widths $W_4$, $W_5$, and $W_6$ can achieve to ranges between 5 nm and 100 nm, between 5 nm and 100 nm, and between 3 nm and 20 nm, respectively. Meanwhile, the first vias 230 and the second vias 240 can achieve a height in a range from 5 nm to 100 nm, and the staggered dielectric spacers 242 achieve a height in a range between 2 nm and 90 nm.

The method 100 and the semiconductor structure 200 may have different embodiments, alternatives and extensions. In one example, the operations 112/114 and the operations 116/118 have a different sequence, such as the operations 116 and 118, and thereafter the operations 112 and 114. The etching processes and etchants to perform the first and second selective etchings could be chosen according to the first and second dielectric materials. In some example where the first dielectric material includes silicon oxide and the second dielectric material includes a high-k dielectric material, the first etching process is a dry etching process using an etchant that includes fluorine-containing gas (such as $CF_2$, $SF_6$, $NF_3$ or a combination thereof) while the second etching process is a dry etching process using an etchant that includes chlorine-containing gas (such as $Cl_2$). In some embodiments, the etchant includes $CH_3F/O_2$ for selectively etching silicon nitride but not etching silicon oxide. In some embodiments, the etchant includes $C_4F_6$ for selectively etching silicon oxide but not etching silicon nitride. In another example, the conductive features 230 and 240 may be other interconnect features, such as metal lines landing on the corresponding underlying conductive features (such as vias or contacts).

Figure 16:
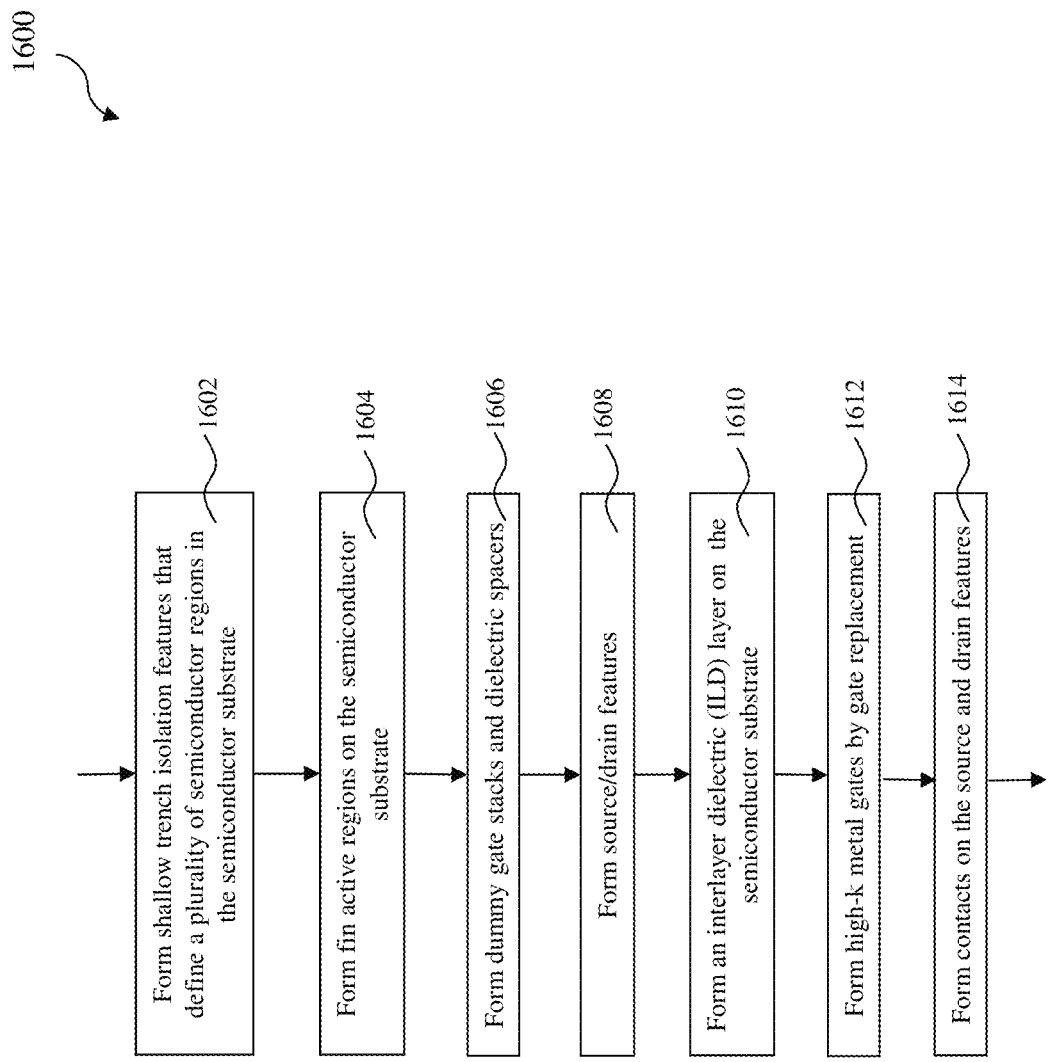
FIG. 16 is a flowchart of a method making a semiconductor structure constructed in accordance with some embodiments.
Figure 17A:
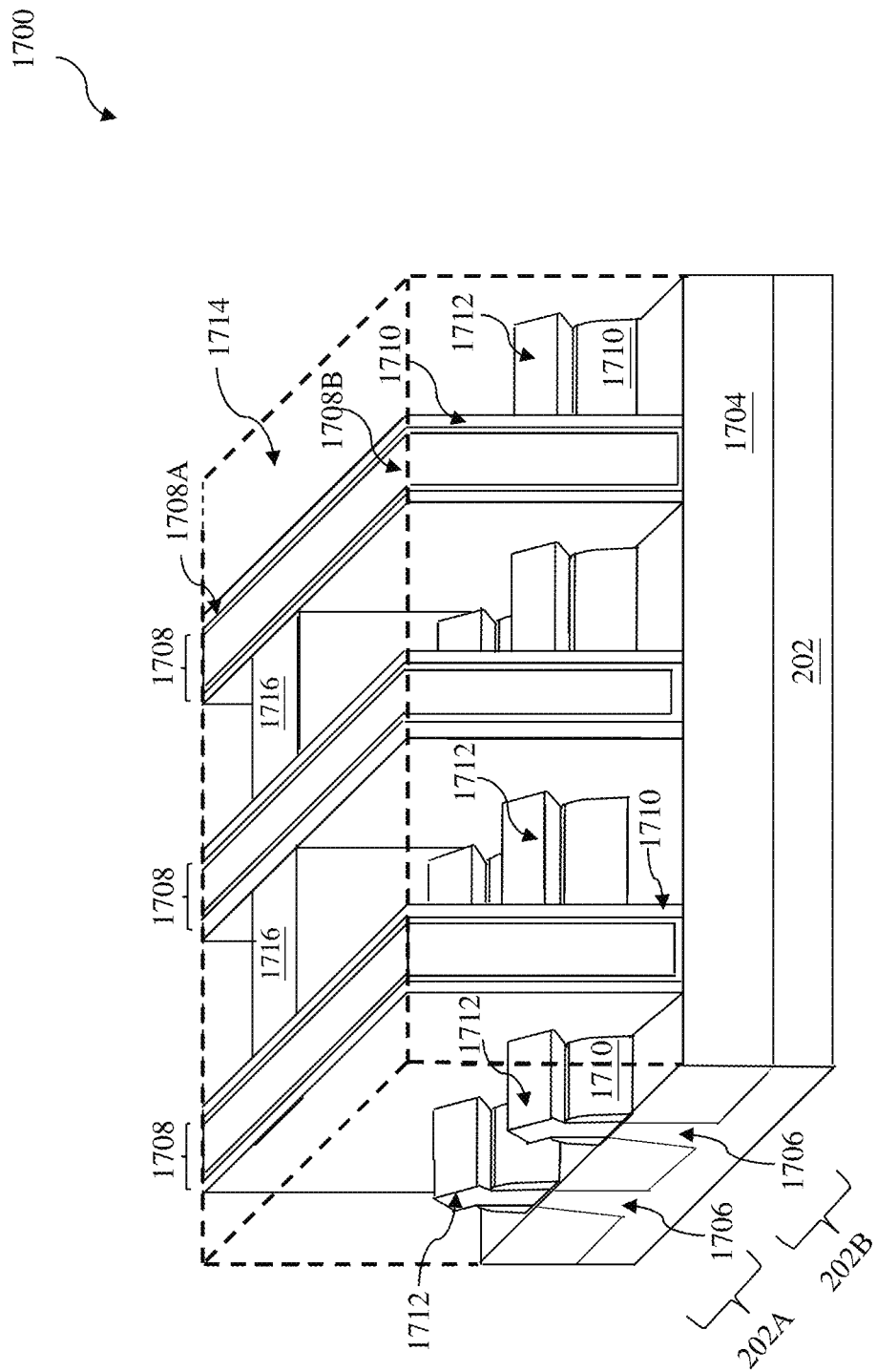
FIGS. 17A and 17B are perspective views of a semiconductor structure at various fabrication stages constructed according to some embodiments.

FIG. 16 is a flowchart of a method 1600 to form fin active regions; FETs; and source/drain contacts constructed in accordance with some embodiments. FIG. 17A is a schematic view of a semiconductor structure 1700 constructed in accordance with some embodiments. The method 1600 incudes the operations 104 and 106 of the method 100. The semiconductor structure 1700 may be portions of the semiconductor structure 200 before the formation of the first via 230, the second via 240 and the SDSADS 220. The method 1600 and the semiconductor structure 1700 are collectively described with reference to FIGS. 16 and 17A.

The method 1600 begins with an operation 1602 by forming shallow trench isolation (STI) features 1704 on the semiconductor substrate 202. In some embodiments, the STI features 1704 are formed by a procedure that includes patterning the substrate to form trenches; filling the trenches with dielectric material; and polishing to remove the excessive dielectric material and to planarize the top surface. In detailed description according to some examples, the patterning process includes a lithography process and etching. The lithography process includes coating, exposure, developing and steps such as baking. A resist is used to define the fin structure may be formed on the hard mask layer. An exemplary resist layer includes a photosensitive material that causes the layer to undergo a property change when exposed to light, such as ultraviolet (UV) light, deep UV (DUV) light or extreme UV (EUV) light. The etching processes may include any suitable etching technique such as dry etching, wet etching, and/or other etching methods (e.g., reactive ion etching (RIE)). One or more dielectric material is filled in the trenches to form the STI feature 1704. Suitable fill dielectric materials include semiconductor oxides, semiconductor nitrides, semiconductor oxynitrides, fluorinated silica glass (FSG), low-K dielectric materials, and/or combinations thereof. In various exemplary embodiments, the dielectric material is deposited using a HDP-CVD process, a sub-atmospheric CVD (SACVD) process, a high-aspect ratio process (HARP), a flowable CVD (FCVD), and/or a spin-on process.

The method 1600 also includes an operation 1604 to form fin active regions 1706. The operation 1604 includes recessing the STI features 1704 such that the fin active regions 1706 are extruded above the STI features 1704. The recessing process employs one or more etching steps (such as dry etch, wet etch or a combination thereof) to selectively etch back the STI features 1704. For example, a wet etching process using hydrofluoric acid may be used to etch when the STI features 1704 are silicon oxide. The fin active regions 1706 have elongated shapes oriented in the X direction, as illustrated in FIG. 17A.

Various doping processes may be applied to the semiconductor regions to form various doped wells, such as n-wells and p-wells at the present stage or before the operation 1604. Various doped wells may be formed in the semiconductor substrate 202 by respective ion implantations.

The method 1600 proceeds to an operation 1606 by forming dummy gates on the fin active regions 1706. The dummy gates are not shown in FIG. 17A and are to be replaced by metal gates 1708 at later fabrication stages. The dummy gates have elongated shapes and are oriented in the Y direction according to the present embodiment. Each of the dummy gates are disposed over multiple fin active regions 1706. The dummy gates may include polysilicon and may additionally include silicon oxide underlying the polysilicon. The dummy gates are formed by deposition and patterning that further includes lithography process and etching.

One or more gate sidewall features (or spacers) 1710 are formed on the sidewalls of the dummy gates. The spacers 1710 may also be formed on the sidewalls of the fin active regions 1706. The gate spacers 1710 includes any suitable dielectric material, such as a semiconductor oxide, a semiconductor nitride, a semiconductor carbon oxide, a semiconductor oxynitride, other suitable dielectric materials, or combinations thereof. The spacers 1710 may have multiple films, such as two films (a silicon oxide film and a silicon nitride film) or three films ((a silicon oxide film; a silicon nitride film; and a silicon oxide film). The formation of the spacers 1710 includes deposition and anisotropic etching, such as dry etching.

The method 1600 proceeds to an operation 1608 by forming various sources and drains (or source and drain features) 1712 to respective FinFETs. The source and drain features 1712 may include both light doped drain (LDD) features and heavily doped source and drain (S/D). Each field effect transistor includes a source and a drain formed on the respective fin active region and interposed by the dummy gate. A channel is formed in the fin active region in a portion that is underlying the dummy gate and spans between the corresponding source and drain 1712. The sources and drains 1712 may be formed to have a raised structure by selective epitaxial growth for strain effect with enhanced carrier mobility and device performance. The dummy gates and the spacers 1710 constrain the sources and drains 1712 to be selectively grown within the source/drain regions with proper profile. In some embodiments, the sources and drains 1712 are formed by one or more epitaxial (epi) processes, whereby Si features, SiGe features, SiC features, and/or other suitable semiconductor features are grown in a crystalline state on the fin active regions 1706. Alternatively, an etching process is applied to recess the source/drain regions before the epitaxial growth. Suitable epitaxial processes include CVD deposition techniques (e.g., vapor-phase epitaxy (VPE) and/or ultra-high vacuum CVD (UHV-CVD), molecular beam epitaxy, atomic layer deposition, and/or other suitable processes. The epitaxial process may use gaseous and/or liquid precursors, which interact with the composition of the fin active regions 1706. In some embodiments, adjacent sources/drains may be grown to merge together to provide increased contact area with reduced contact resistance.

The method 1600 proceeds to an operation 1610, in which an inter-level dielectric material (ILD) layer 1714 is formed on the semiconductor substrate 202, covering the sources and drains 1712. The ILD layer 1714 is drawn with dashed lines in FIG. 17A and is illustrated as transparent to have better view of other features (such as the fin active regions 1706) embedded in the ILD layer 1714. The ILD layer 1714 surrounds the dummy gates allowing the dummy gates to be removed and a replacement gate to be formed in the resulting cavity. The ILD layer 1714 is also a part of an electrical interconnect structure that electrically interconnects various devices of the semiconductor structure 1700. In such embodiments, the ILD layer 1714 acts as an insulator that supports and isolates the conductive traces. The ILD layer 1714 may include any suitable dielectric material, such as a semiconductor oxide, a semiconductor nitride, a semiconductor oxynitride, other suitable dielectric materials, or combinations thereof. In some embodiments, the ILD layer 1714 includes a low-k dielectric material (with a dielectric constant less than that of silicon oxide). The formation of the ILD layer 1714 may include deposition and CMP to provide a planarized top surface.

The method 1600 proceeds to an operation 1612 for gate replacement. The dummy gates are removed and replaced by gates 1708 with high-k dielectric material and metal, therefore also referred to as high-k metal gates (or metal gates) 1708. The gate replacement process may include etching, deposition and polishing. In the present embodiment, the dummy gates are selectively removed by etching, resulting in gate cavities (or gate trenches). Then the gate materials, such as high k dielectric material and metal, are deposited in the gate trenches to form the high-k metal gates 1708. A CMP process is further implemented to polish and remove the excessive gate materials from the semiconductor structure 1600.

The metal gates 1708 are formed in the gate trenches by a proper procedure, such as a gate-last process or a high-k-last process, although it is understood that the metal gates 1708 may have any suitable gate structure and may be formed by any suitable procedure. A metal gate 1708 is formed on the semiconductor substrate 202 overlying the channel of the fin active region 1706. The metal gates 1708 include a gate dielectric layer 1708A and a gate electrode 1708B disposed on the gate dielectric layer 1708A. In the present embodiment, the gate dielectric layer 1708A includes a high-k dielectric material and the gate electrode 1708B includes metal or metal alloy. In some examples, the gate dielectric layer 1708A and the gate electrode 1708B each may include multiple films. The high-k dielectric material may include metal oxide (such as LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$), metal nitride, $Si_3N_4$, silicon oxynitrides (SiON), or other suitable dielectric materials. The gate electrode 1708B may include Ti, Ag, Al, TiAlN, TaC, TaCN, TaSiN, Mn, Zr, TiN, TaN, Ru, Mo, Al, WN, Cu, W, Ru, Co, or any suitable conductive materials. In some embodiments, different metal materials are used for n-type FET (nFET) and p-type FET (pFET) devices with respective work functions to reduce threshold voltage and enhance device performance. In some other embodiments, the gate dielectric layer 1708A is formed in the high-k last process, in which the gate dielectric layer 1708A is deposited in the gate trench and is U-shaped, as illustrated in FIG. 17A.

The gate dielectric layer 1708A may further include an interfacial layer interposed between the high-k dielectric material layer and the corresponding fin active region 1706. The interfacial layer may include silicon oxide, silicon nitride, silicon oxynitride, and/or other suitable material. The interfacial layer is deposited by a suitable method, such as ALD, CVD, ozone oxidation, etc. The high-k dielectric layer is deposited on the interfacial layer (if the interfacial layer presents) by a suitable technique, such as ALD, CVD, metal-organic CVD (MOCVD), PVD, thermal oxidation, combinations thereof, and/or other suitable techniques.

The gate electrode 1708B may include multiple conductive materials. In some embodiments, the gate electrode 1708B includes a capping layer, a blocking layer, a work function (WF) metal layer, and a filling metal layer. In furtherance of the embodiments, the capping layer includes titanium nitride, tantalum nitride, or other suitable material, formed by a proper deposition technique such as ALD. The blocking layer includes titanium nitride, tantalum nitride, or other suitable material, formed by a proper deposition technique such as ALD.

The WF metal layer includes a conductive layer of metal or metal alloy with proper work function such that the corresponding FET has a reduced threshold voltage and is enhanced for its device performance. The WF metal layer for a pFET (such as in the first region 202A) and the WF metal layer for a nFET (such as in the second region 202B) are different in composition, being referred to as an p-type WF metal and a n-type WF metal, respectively. Particularly, an n-type WF metal is a metal having a first work function such that the threshold voltage of the associated nFET is reduced. The n-type WF metal has a work function close to the silicon conduction band energy (Ec) or lower work function, presenting easier electron escape. For example, the n-type WF metal has a work function of about 4.2 eV or less. A p-type WF metal is a metal having a second work function such that the threshold voltage of the associated pFET is reduced. The p-type WF metal has a work function close to the silicon valence band energy (Ev) or higher work function, presenting strong electron bonding energy to the nuclei. For example, the p-type work function metal has a WF of about 5.2 eV or higher. In some embodiments, the n-type WF metal includes tantalum (Ta). In other embodiments, the n-type WF metal includes titanium aluminum (TiAl), titanium aluminum nitride (TiAlN), or combinations thereof. In other embodiments, the n-metal include Ta, TiAl, TiAlN, tungsten nitride (WN), or combinations thereof. In some embodiments, the p-type WF metal includes titanium nitride (TiN) or tantalum nitride (TaN). In other embodiments, the p-metal include TiN, TaN, tungsten nitride (WN), titanium aluminum (TiAl), or combinations thereof. The work function metal is deposited by a suitable technique, such as PVD. The n-type WF metal or the p-type WF metal may include various metal-based films as a stack for optimized device performance and processing compatibility.

The method 1600 may also include an operation 1614 to form one or more contact 1716 landing on source and drain features 1712. FIG. 17A only provides two exemplary contacts for illustration, it is understood that a plurality of the contacts 1716 are formed and are landing on respective source and drain features 1712. The operation 1614 may include patterning the ILD layer 1714 to form contact holes; depositing conductive material in the contact holes; and polishing by CMP, in accordance with some embodiments. The patterning process may use a self-aligned etching process to selectively etch the ILD layer 1714 using the spacers 1710 to constrain the etching process to be self-aligned with the respective source and drains. The conductive material includes cobalt, ruthenium, nickel, tungsten, copper, aluminum, other suitable metal or metal alloy, or a combination thereof.

Figure 17B:
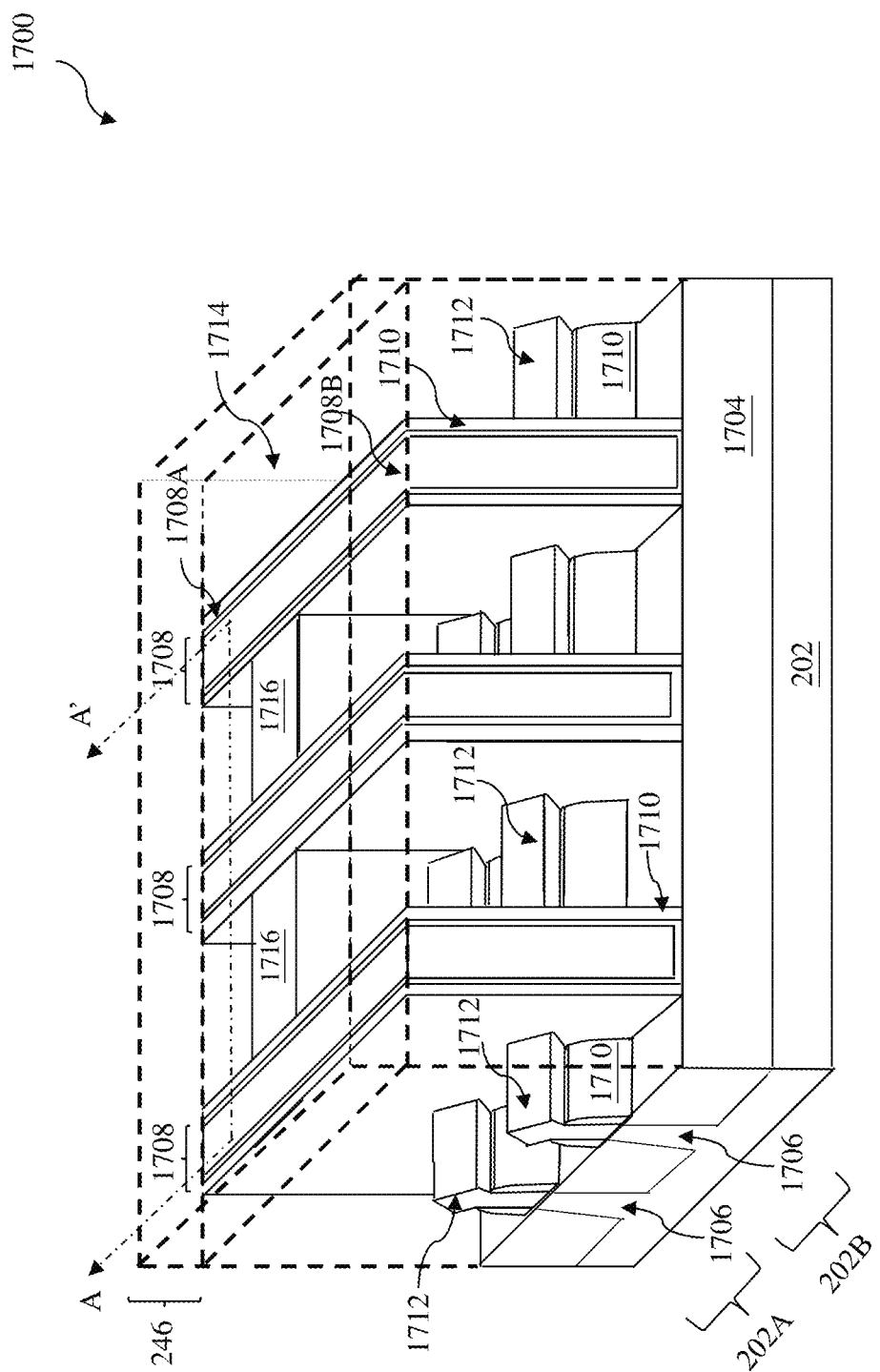
Figure 17C:
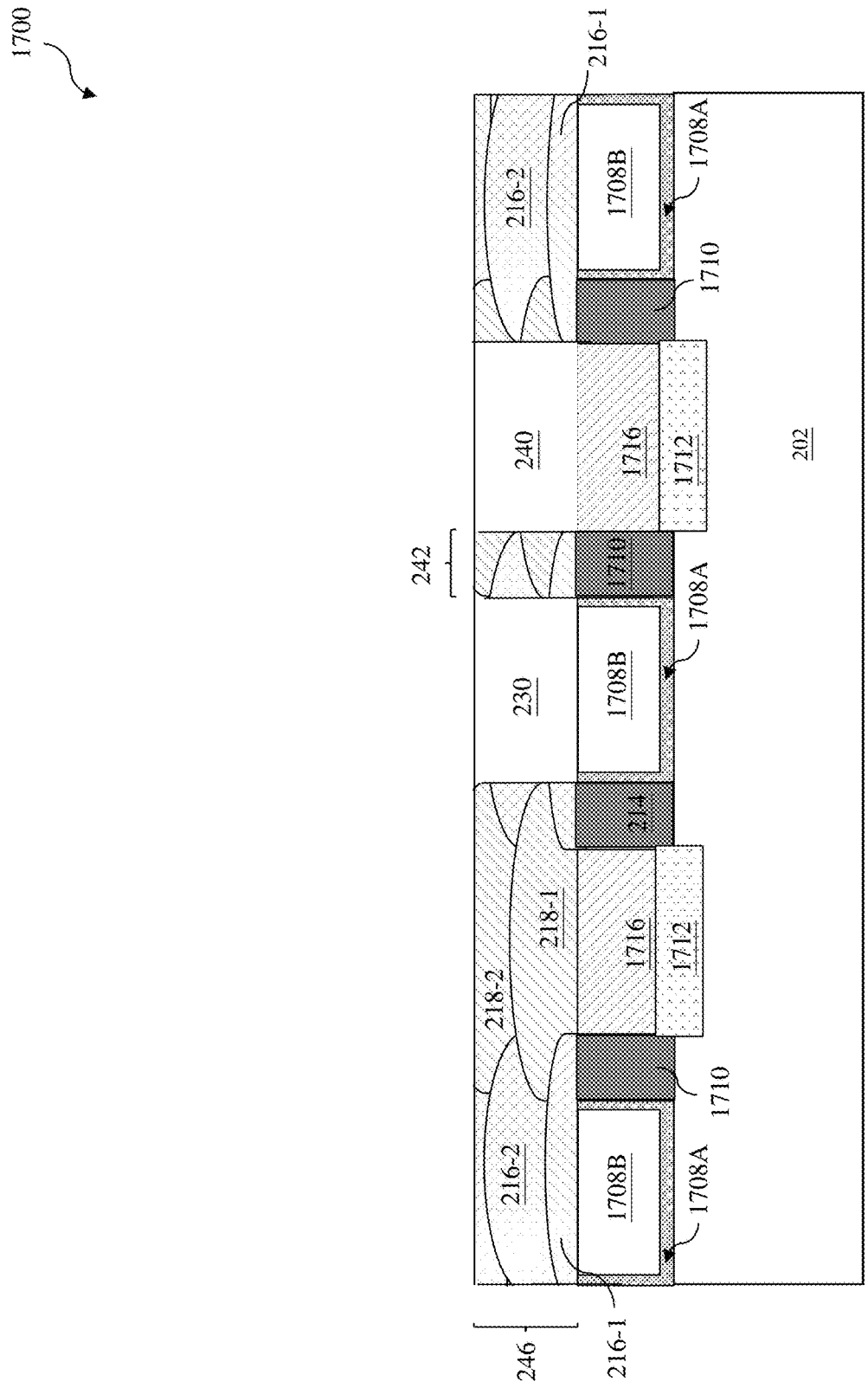
FIG. 17C is a sectional view of the semiconductor structure of FIG. 17B, in portion, constructed according to some embodiments.

Thereafter, the staggered self-aligned contact/via structure 246 is formed on the semiconductor structure 1700, as illustrated in FIG. 17B, by various operations (such as operations 110 through 118) in the method 100 of FIG. 1A as previously described. FIG. 17C is a sectional view of the semiconductor structure 1700 of FIG. 17B, in portion, constructed in accordance with some embodiments.

Back to the procedure 110 of FIG. 1B to form the SDSADS 220 by selective depositions. The procedure 110 includes the operation 152 for the first selective deposition and the operation 154 for the second selective deposition. A selective deposition depends on many factors including deposition process, the composition of the deposited dielectric material, and deposition surface. Accordingly, the first and second selective deposition processes are tuned by choosing proper combinations of the deposition process, compositions of the first and second dielectric materials, and deposition surface.

In some embodiments, the first conductive features 210 and the second conductive features are different conductive materials and may provide deposition selectivity. For example, the first conductive features 210 include copper and the second conductive features 212 include tungsten. In other examples, the first conductive features 210 include aluminum, metal alloy, silicide, or a combination thereof while the second conductive features 212 include copper, tungsten, nickel or a combination thereof. In this case, the procedure 110 starts on the semiconductor structure 200 illustrated in FIG. 2.

Alternatively, the method 100 includes the operation 108 to treat or modify the surface of the semiconductor structure 200 to enhance and ensure the selective depositions prior to the procedure 110. Several embodiments are described below.

Figure 18:
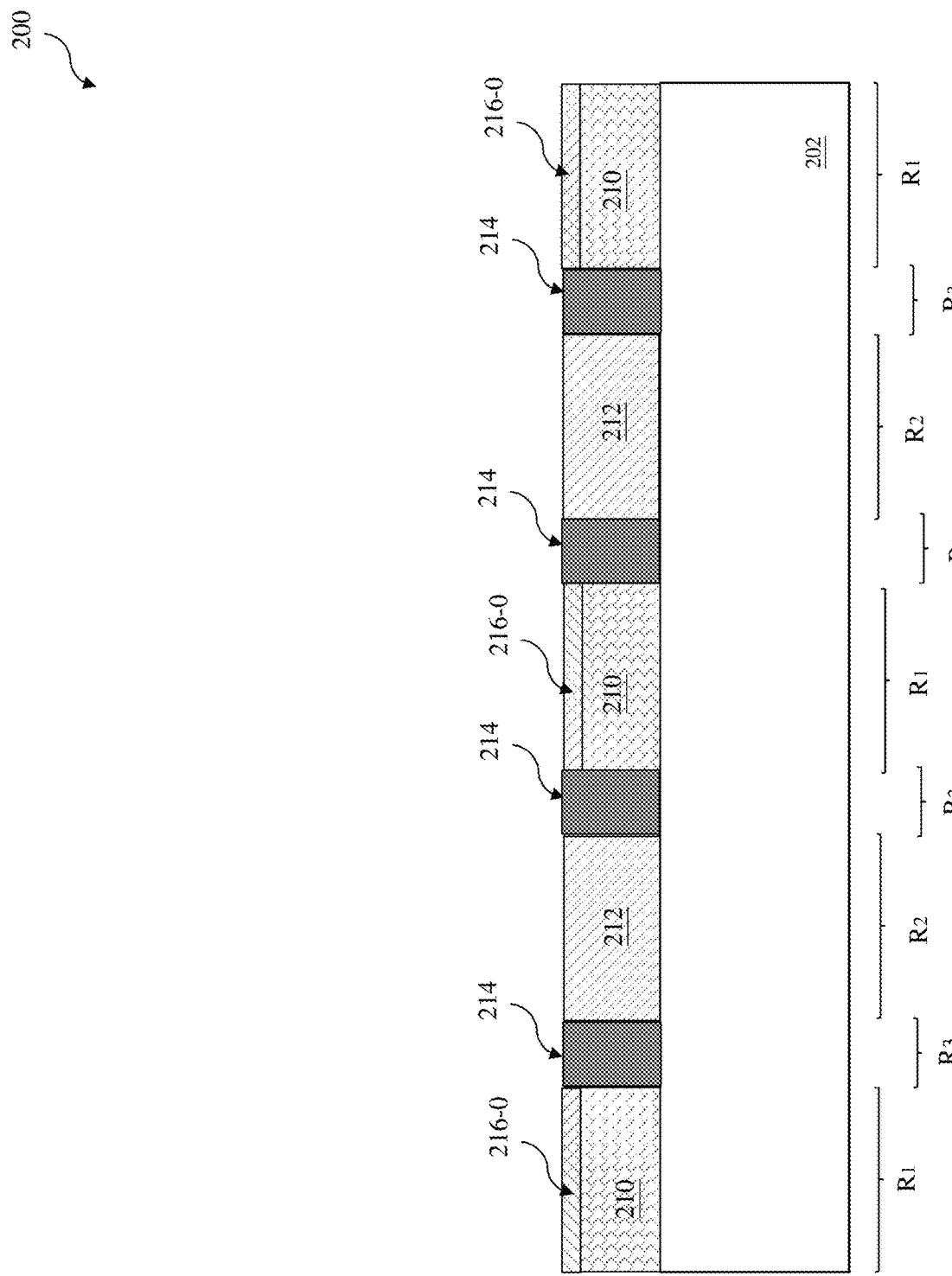
FIGS. 18 and 19 are sectional views of a semiconductor structure at various fabrication stages constructed according to some embodiments.
Figure 19:
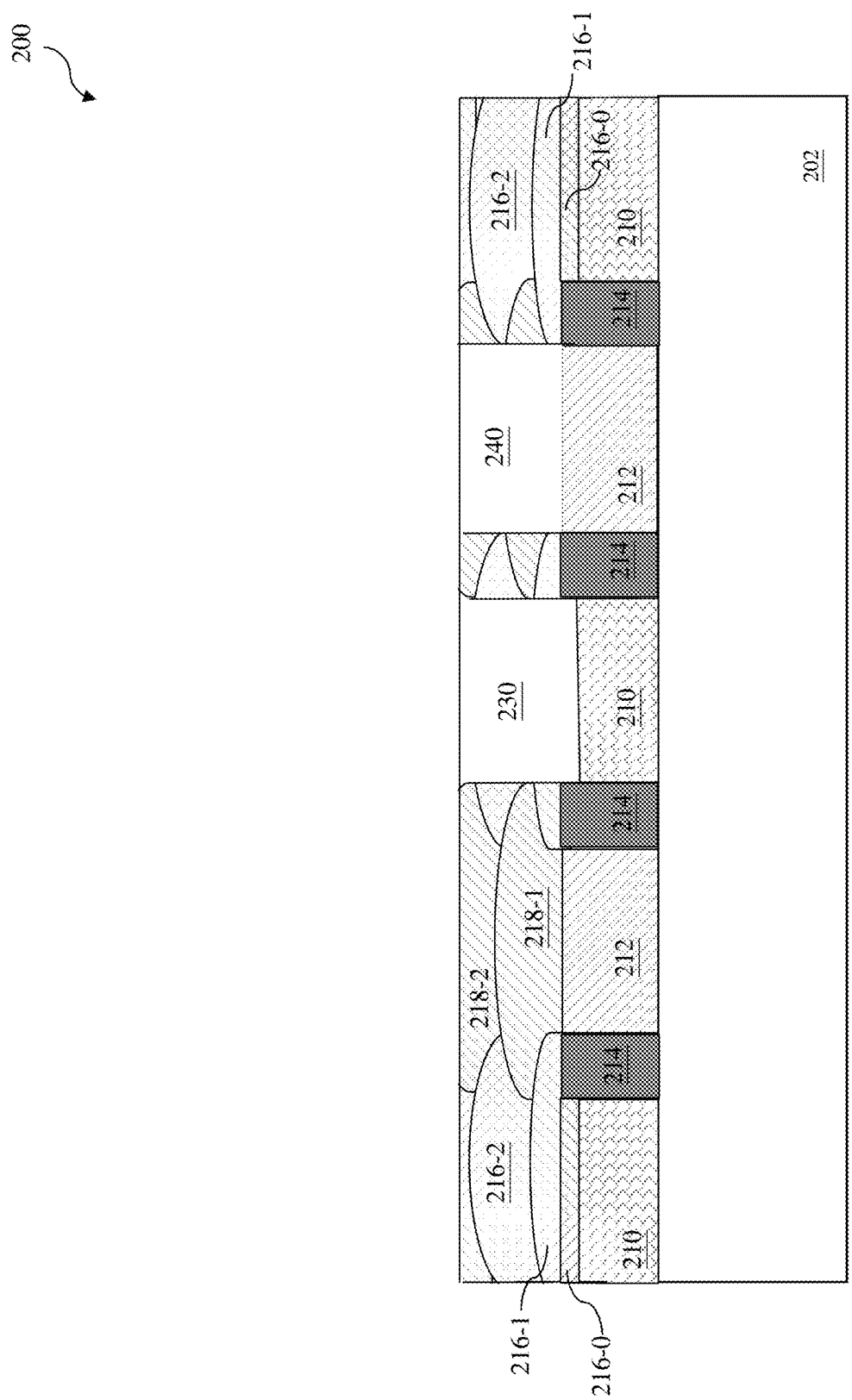

In some embodiments, the first regions $R_1$ are modified to have the first dielectric material (referred to as first dielectric layer 216-0) on the top, as illustrated in FIG. 18. In furtherance of the embodiments, the operation 108 includes selectively etching to recess the first conductive features 210, depositing the first dielectric material; and perform a CMP process to remove the first dielectric material deposited on the other regions and planarize the top surface. Thus, the first regions $R_1$ have surfaces of the first dielectric material different from that (a conductive material) in the second regions $R_2$ and that (a different dielectric material) in the third regions $R_3$. In this case, the first patterning process in the operation 112 continues to etch through the first dielectric layer 216-0 until the first conductive features 210 are exposed in the corresponding trenches. Accordingly, the first via 230 extends to the recessed surface of the first conductive feature 210 in the final structure, as illustrated in FIG. 19.

Figure 20:
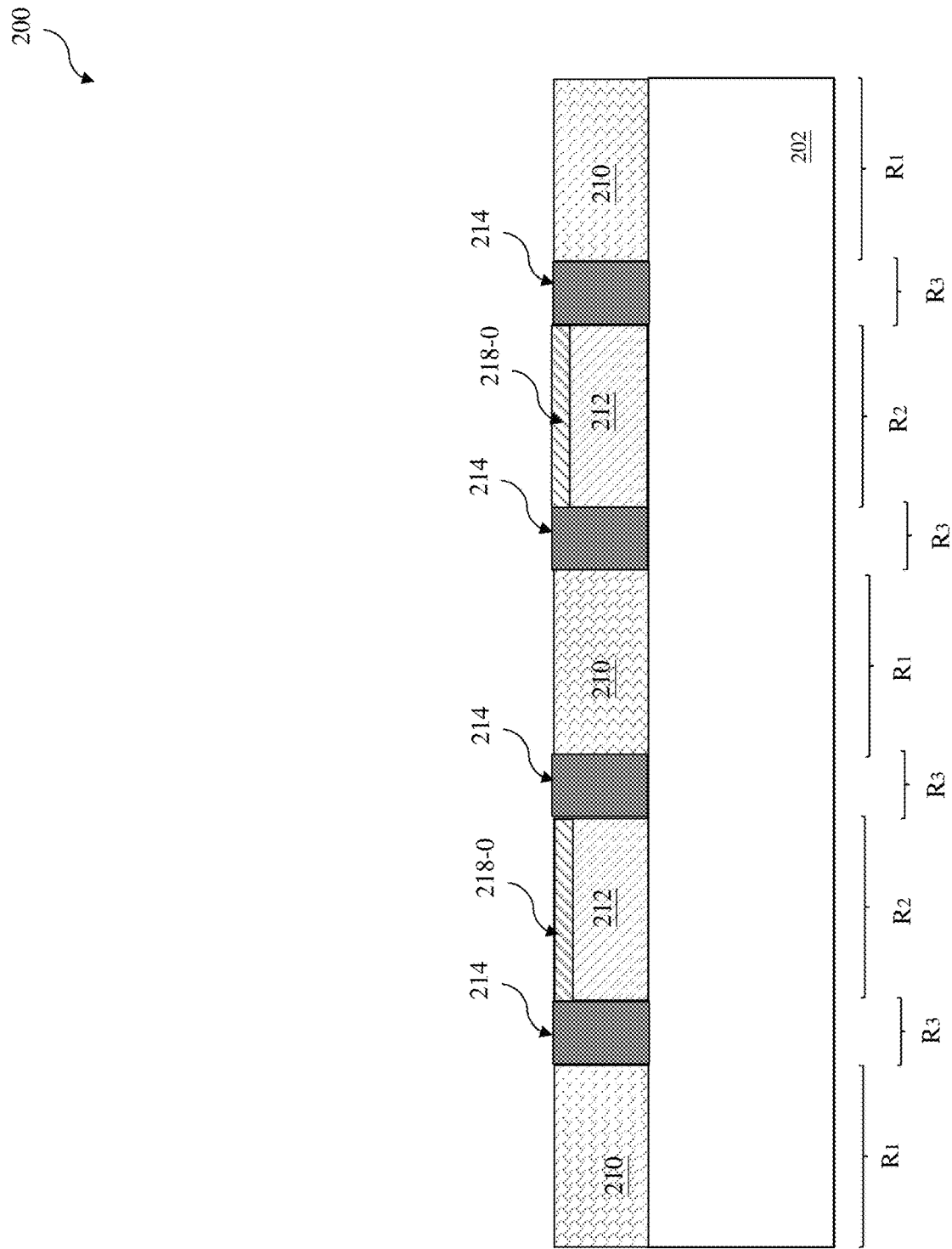
FIGS. 20 and 21 are sectional views of a semiconductor structure at various fabrication stages constructed according to some embodiments.
Figure 21:
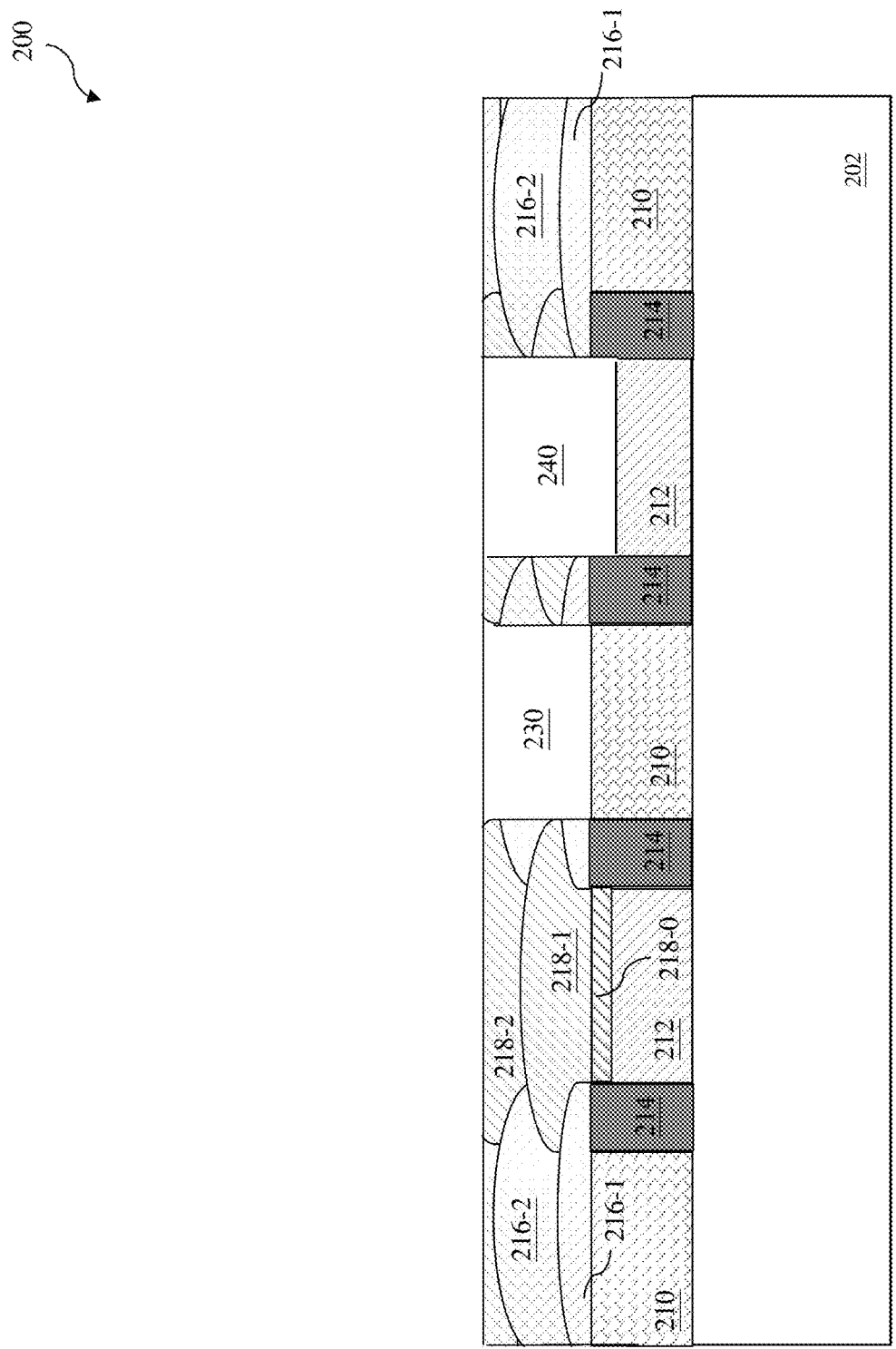

In some embodiments, the second conductive features 212 are modified to have the second dielectric material (referred to as second dielectric layer 218-0) on the top, as illustrated in FIG. 20. In furtherance of the embodiments, the operation 108 includes selectively etching to recess the second conductive features 212, depositing the second dielectric material; and perform a CMP process to remove the second dielectric material deposited on the other regions and planarize the top surface. Thus, the second regions $R_2$ have surfaces of the second dielectric material different from that (a conductive material) in the first regions $R_1$ and that (a different dielectric material) in the third regions R3. The procedure 110 for selective deposition starts on the semiconductor structure 200 of FIG. 20. In this case, the second patterning process in the operation 116 continues to etch through the second dielectric layer 218-0 until the second conductive features 212 are exposed in the corresponding trenches. Accordingly, the second via 240 extends to the recessed surface of the second conductive feature 212 in the final structure, as illustrated in FIG. 21.

Figure 22:
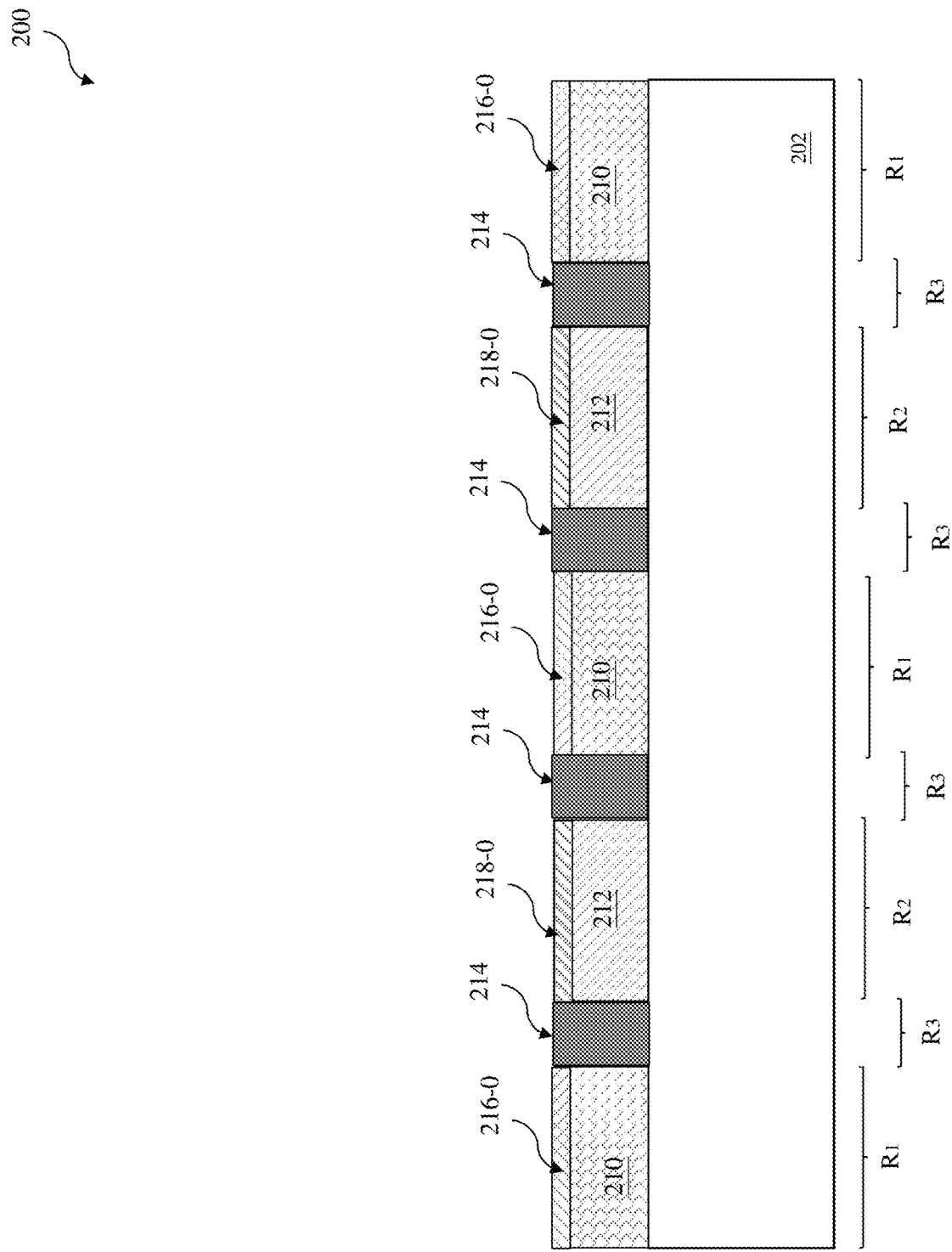
FIGS. 22 and 23 are sectional views of a semiconductor structure at various fabrication stages constructed according to some embodiments.
Figure 23:
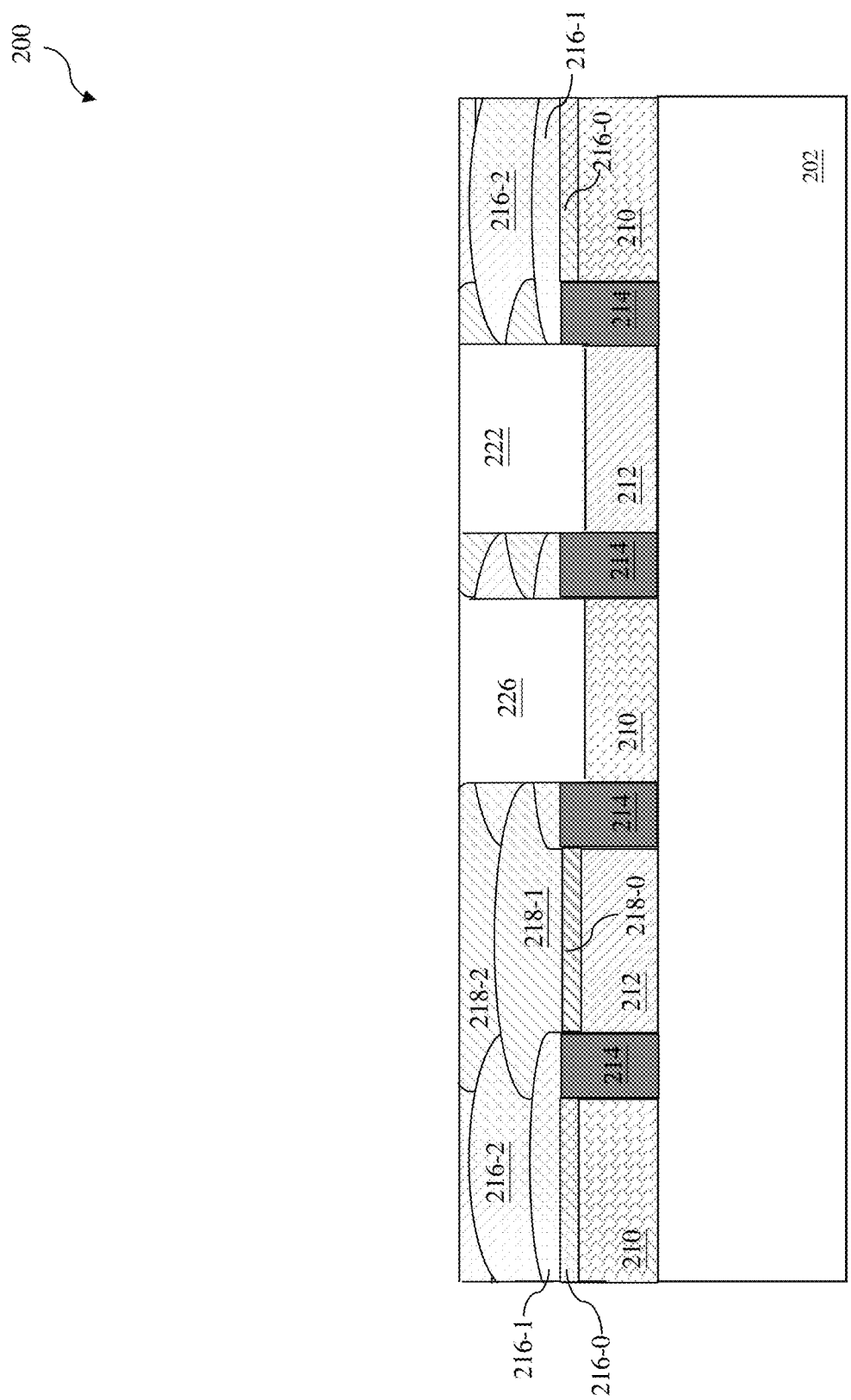

In some embodiments, both the first conductive features 210 and the second conductive features 212 are modified to have the first dielectric layer 216-0 on the top of the first conductive features 210 and the second dielectric layer 218-0 on the top of the second conductive features 212, respectively, as illustrated in FIG. 22. In furtherance of the embodiments, the operation 108 includes two procedures in either sequence. The first procedure includes selectively etching to recess the first conductive features 210, depositing the first dielectric material; and perform a CMP process to remove the first dielectric material deposited on the other regions and planarize the top surface. The second procedure includes selectively etching to recess the second conductive features 212, depositing the second dielectric material; and perform a CMP process to remove the second dielectric material deposited on the other regions and planarize the top surface. The CMP process may be collectively performed once at the end of the operation 108. Thus, the first regions $R_1$ have surfaces of the first dielectric material; the second regions $R_2$ have surfaces of the second dielectric material different; and the third regions $R_3$ have a dielectric material different from the first and second dielectric materials in composition. The procedure 110 for selective deposition starts on the semiconductor structure 200 of FIG. 22. Similarly, the first via 230 extends to the recessed surface of the first conductive feature 210 and the second via 240 extends to the recessed surface of the second conductive feature 212 in the final structure, as illustrated in FIG. 23.

In some embodiments, one or two of the first regions $R_1$, the second regions $R_2$, and the third regions $R_3$ are treated with an inhibitor to provide or enhance the deposition selectivity.

Other fabrication steps may be implemented before, during and after the operations of the method. For example, various metal lines and vias in the interconnect structure are further formed on the semiconductor structure to electrically connect various FinFETs and other devices into a functional circuit by proper technique, such as dual damascene process. Particularly, the gate electrodes are electrically connected through the first vias 230; and the source and drain features are electrically connected through the second conductive features 212 and the second via 240. In various patterning processes above in the method 100, each patterning procedure may be implemented through double patterning or multiple patterning.

The present disclosure provides an IC and a method making the same in accordance with various embodiments. Especially, the IC structure includes a staggered dual self-aligned dielectric structure, and vias formed therein and aligned with underlying conductive features. The method includes selective depositions of a first dielectric material and a second dielectric material interdigitated, and selective etching processes. The method employed two dielectric materials to form the staggered dual self-aligned dielectric structure with increased throughput and reduced fabrication cost by patterning without using lithography process. Such formed vias provide electrical routing to various components, such as gate electrodes, sources and drains.

Thus, the present disclosure provides a semiconductor structure in accordance with some embodiments. The semiconductor structure includes a semiconductor substrate; a first conductive feature and a second conductive feature disposed on the semiconductor substrate; and a staggered dielectric feature interposed between the first and second conductive feature. The staggered dielectric feature includes first dielectric layers and second dielectric layers being interdigitated. The first dielectric layers include a first dielectric material and the second dielectric layers include a second dielectric material being different from the first dielectric material.

The present disclosure provides a method forming an integrated circuit structure in accordance with some embodiments. The method includes providing a semiconductor structure having a first conductive feature in a first region and a second conductive feature in a second region, and a dielectric spacer interposed between the first and second conductive features; selectively depositing a first dielectric film of a first dielectric material on the first contact, wherein the selectively depositing of the first dielectric film includes laterally extends the first dielectric film to the dielectric spacer; and selectively depositing a second dielectric film of a second dielectric material on the second contact. The selectively depositing of the second dielectric film includes laterally extends the second dielectric film to a lateral extended portion of the first dielectric film over the dielectric spacer. The second dielectric material is different from the first dielectric material in composition.

The present disclosure provides a method in accordance with some other embodiments. The method includes providing a semiconductor structure that includes a first conductive feature in a first region, a second conductive feature in a second region, and a dielectric spacer in a third region interposing between the first and second regions; selectively depositing a first dielectric material in the first region, wherein the selectively depositing of the first dielectric material includes laterally extending the first dielectric material to the third region; selectively depositing a second dielectric material in the second region, wherein the selectively depositing of the second dielectric material includes laterally extending the second dielectric material to the third region, wherein the second dielectric material is different from the first dielectric material in composition; and repeatedly depositing the first and second dielectric materials to form a collective dielectric layer that includes the first dielectric material in the first region, the second dielectric material in the second region, and a dielectric structure of the first and second dielectric materials interdigitated in the third region.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor structure, comprising:
    a semiconductor substrate;
    a first via feature and a second via feature disposed on the semiconductor substrate; and
    a staggered dielectric feature interposed between the first and second via features, wherein
    the staggered dielectric feature includes a plurality of first dielectric layers and a plurality of second dielectric layers being interdigitated,
    the first dielectric layers include a first dielectric material and the second dielectric layers include a second dielectric material being different from the first dielectric material, and
    each of the first dielectric layers and each of the second dielectric layers continuously extends from the first via feature to the second via feature, and contacts both the first and second via features.

2. The semiconductor structure of claim 1, further comprising a first conductive feature and a second conductive feature disposed on the semiconductor substrate, wherein the first via feature and the second via feature are directly landing on the first and second conductive features, respectively.

3. The semiconductor structure of claim 2, further comprising a dielectric spacer underlying and contacting the staggered dielectric feature, wherein the dielectric spacer laterally contacts both the first and second conductive features.

4. The semiconductor structure of claim 3, wherein the staggered dielectric feature is aligned with and is completely overlapped with the dielectric spacer.

5. The semiconductor structure of claim 1, wherein
    the staggered dielectric feature spans between a first edge of the first via feature and a second edge of the second via feature,
    each of the first dielectric layers has a first varying thickness decreased from the first edge to the second edge, and
    each of the second dielectric layers has a second varying thickness increased from the first edge to the second edge.

6. The semiconductor structure of claim 5, wherein
    one of the first dielectric layers has a first thickness T1 at the first edge and a second thickness T2 at the second edge;

one of the second dielectric layers has a third thickness T3 at the first edge and a fourth thickness T4 at the second edge; and T1 is greater than T3 and T2 is less than T4.

7. The semiconductor structure of claim 1, wherein the first dielectric material is a silicon-containing dielectric material and the second dielectric material is a metal-containing dielectric material.

8. The semiconductor structure of claim 7, wherein the first dielectric material includes one of silicon oxide, silicon nitride and silicon oxynitride, and the second dielectric material includes one of hafnium oxide, zirconium oxide, lanthanum oxide, and aluminum oxide.

9. A semiconductor structure, comprising:
a semiconductor substrate;
a first conductive feature and a second conductive feature disposed on the semiconductor substrate;
a first via feature and a second via feature landing on the first and second conductive features, respectively; and
a staggered dielectric feature spans between a first edge of the first via feature and a second edge of the second via feature, wherein
the staggered dielectric feature includes a plurality of first dielectric layers and a plurality of second dielectric layers being interdigitated,
the first dielectric layers include a first dielectric material and the second dielectric layers include a second dielectric material being different from the first dielectric material,
each of the first dielectric layers continuously extends from the first edge to the second edge, and has a first varying thickness decreased from the first edge to the second edge, and
each of the second dielectric layers continuously extends from the first edge to the second edge, and has a second varying thickness increased from the first edge to the second edge.

10. The semiconductor structure of claim 9, further comprising a dielectric spacer underlying and contacting the staggered dielectric feature, wherein the dielectric spacer laterally contacts both the first and second conductive features.

11. The semiconductor structure of claim 10, wherein the dielectric spacer spans between the first edge and the second edge, and the dielectric spacer is completely overlapped with the staggered dielectric feature.

12. The semiconductor structure of claim 11, wherein
one of the first dielectric layers has a first thickness T1 at the first edge and a second thickness T2 at the second edge;
one of the second dielectric layers has a third thickness T3 at the first edge and a fourth thickness T4 at the second edge; and T1 is greater than T3 and T2 is less than T4.

13. The semiconductor structure of claim 9, wherein the first dielectric material is a silicon-containing dielectric material and the second dielectric material is a metal-containing dielectric material.

14. The semiconductor structure of claim 13, wherein the first dielectric material includes one of silicon oxide, silicon nitride and silicon oxynitride, and the second dielectric material includes one of hafnium oxide, zirconium oxide, lanthanum oxide, and aluminum oxide.

15. A method, comprising:
providing a semiconductor structure having a first conductive feature in a first region, a second conductive feature in a second region, and a dielectric spacer in a third region and interposed between the first and second conductive features;
selectively depositing a first dielectric layer of a first dielectric material in the first region, wherein the selectively depositing of the first dielectric layer includes laterally extends the first dielectric layer to the third region;
selectively depositing a second dielectric layer of a second dielectric material in the second region, wherein the selectively depositing of the second dielectric layer includes laterally extends the second dielectric layer to the third region, wherein the second dielectric material is different from the first dielectric material in composition; and
performing a first etching process to selectively etch the first dielectric material, thereby forming a first trench in the first region and leaving a staggered dielectric feature of the first and second dielectric materials in the third region.

16. The method of claim 15, wherein
the dielectric spacer includes a first edge laterally contacting the first conductive feature and a second edge laterally contacting the second conductive feature;
the selectively depositing of the first dielectric layer includes laterally extends the first dielectric layer to the second edge; and
the selectively depositing of the second dielectric layer includes laterally extends the second dielectric layer over the first dielectric layer to the first edge.

17. The method of claim 16, further comprising repeatedly depositing the first dielectric material and the second dielectric material to form a collective dielectric layer of the first and second dielectric materials until a thickness of the collective dielectric layer reaches a desired thickness, prior to the performing of the first etching process.

18. The method of claim 15, wherein
the selectively depositing of the first dielectric layer includes performing a first atomic layer deposition (ALD) process using a first precursor; and
the selectively depositing of the second dielectric layer includes performing a second ALD process using a second precursor different from the first precursor.

19. The method of claim 15, further comprising
forming a first via feature in the first trench, wherein the first via feature electrically connects to the first conductive feature;
performing a second etching process to selectively etch the second dielectric material, thereby forming a second trench in the second region; and
forming a second via in the second trench, wherein the second via feature electrically connects to the second conductive feature, wherein the first and the second via features are isolated from each other by the staggered dielectric feature.

20. The method of claim 15, further comprising forming an inhibitor on the second conductive feature in the second region before the selectively depositing of the first dielectric layer of the first dielectric material on the first conductive feature.

* * * * *